(12) United States Patent
Min et al.

(10) Patent No.: US 12,309,924 B2
(45) Date of Patent: May 20, 2025

(54) CONNECTION STRUCTURE EMBEDDED SUBSTRATE AND SUBSTRATE STRUCTURE INCLUDING THE SAME

(71) Applicant: SAMSUNG ELECTRO-MECHANICS CO., LTD., Suwon-si (KR)

(72) Inventors: Tae Hong Min, Suwon-si (KR); Ho Hyung Ham, Suwon-si (KR); Yong Soon Jang, Suwon-si (KR); Ki Suk Kim, Suwon-si (KR); Hyung Ki Lee, Suwon-si (KR); Chi Won Hwang, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 166 days.

(21) Appl. No.: 18/138,901

(22) Filed: Apr. 25, 2023

(65) Prior Publication Data
US 2023/0262891 A1 Aug. 17, 2023

Related U.S. Application Data

(62) Division of application No. 17/371,813, filed on Jul. 9, 2021, now Pat. No. 11,737,211.

(30) Foreign Application Priority Data

Mar. 30, 2021 (KR) .................. 10-2021-0041112

(51) Int. Cl.
*H05K 1/11* (2006.01)
*G06F 1/18* (2006.01)

(52) U.S. Cl.
CPC .............. *H05K 1/115* (2013.01); *G06F 1/189* (2013.01); *H05K 2201/0338* (2013.01); *H05K 2201/041* (2013.01)

(58) Field of Classification Search
CPC .......... H05K 1/11; H05K 1/111; H05K 1/113; H05K 1/115; H05K 1/183; H05K 1/185; H05K 1/0298
See application file for complete search history.

(56) References Cited

U.S. PATENT DOCUMENTS 9,425,159 B2 8/2016 Terui
10,903,170 B2 1/2021 Lee et al.
(Continued)

FOREIGN PATENT DOCUMENTS

JP 2010-123799 A 6/2010
KR 10-2020-0028602 A 3/2020
(Continued)

OTHER PUBLICATIONS

U.S. Notice of Allowance dated Apr. 25, 2023 issued in U.S. Appl. No. 17/371,813.
(Continued)

*Primary Examiner* — Timothy J Thompson
*Assistant Examiner* — John B Freal
(74) *Attorney, Agent, or Firm* — Morgan Lewis & Bockius LLP

(57) ABSTRACT

A connection structure embedded substrate includes: a printed circuit board including a plurality of first insulating layers and a plurality of first wiring layers, respectively disposed on or between the plurality of first insulating layers; and a connection structure disposed in the printed circuit board and including a plurality of internal insulating layers and a plurality of internal wiring layers, respectively disposed on or between the plurality of internal insulating layers. Among the plurality of internal wiring layers, an internal wiring layer disposed in one surface of the connec- (Continued)

tion structure is in contact with one surface of a first insulating layer, among the plurality of first insulating layers.

20 Claims, 14 Drawing Sheets

(56) References Cited

U.S. PATENT DOCUMENTS

| | | | |
|---|---|---|---|
| 2014/0360767 A1* | 12/2014 | Terui | H01L 24/19 |
| | | | 174/261 |
| 2015/0116965 A1 | 4/2015 | Kim | |
| 2017/0150603 A1 | 5/2017 | Yamamura | |
| 2020/0083179 A1* | 3/2020 | Lee | H01L 23/5384 |
| 2020/0312797 A1 | 10/2020 | Kang et al. | |
| 2021/0045248 A1 | 2/2021 | Tang | |
| 2022/0007511 A1 | 1/2022 | Jeong | |
| 2022/0061158 A1* | 2/2022 | Jung | H05K 1/186 |
| 2022/0157730 A1 | 5/2022 | Jang | |
| 2022/0192020 A1 | 6/2022 | Jung | |

FOREIGN PATENT DOCUMENTS

| | | |
|---|---|---|
| KR | 10-2020-0069573 A | 6/2020 |
| KR | 10-2020-0085918 A | 7/2020 |
| KR | 10-2020-0114084 A | 10/2020 |
| KR | 10-2163059 B1 | 10/2020 |
| KR | 10-2022-0065550 A | 5/2022 |

OTHER PUBLICATIONS

U.S. Office Action dated Jan. 19, 2023 issued in U.S. Appl. No. 17/371,813.
Korean Office Action dated Feb. 25, 2025 issued in Korean Patent Application No. 10-2021-0041112 (with English translation).

* cited by examiner

CONNECTION STRUCTURE EMBEDDED SUBSTRATE AND SUBSTRATE STRUCTURE INCLUDING THE SAME

CROSS-REFERENCE TO RELATED APPLICATION(S)

This application is a divisional of U.S. patent application Ser. No. 17/371,813, filed on Jul. 9, 2021, which claims the benefit of priority to Korean Patent Application No. 10-2021-0041112, filed on Mar. 30, 2021, the entire disclosures of which are incorporated herein by reference.

TECHNICAL FIELD

The present disclosure relates to a connection structure embedded substrate and a substrate structure including the same.

BACKGROUND

As the market has recently changed from an existing portable device-oriented business to high-capacity servers, high-multilayer printed circuit boards are expanding into the 5G high-speed communications and artificial intelligence (AI) fields. A size of a printed circuit board is gradually decreasing, but the degree of the decrease is gradually slowing down. Accordingly, embedded technologies such as a fan-out multi-chip module (FOMCM), a fan-out embedded bridge (FOEB), and an embedded multi-die interconnect bridge (EMIB) have been developed as technologies for manufacturing thinned redistribution layers and large package substrates.

SUMMARY

An aspect of the present disclosure is to embed a connection structure in a substrate without a separate adhesive for bonding the connection structure.

Another aspect of the present disclosure is to provide a printed circuit board which may be further thinned and miniaturized by embedding a connection structure therein.

Another aspect of the present disclosure is to provide a printed circuit board which may improve yield in a substrate manufacturing process.

Another aspect of the present disclosure is to provide a printed circuit board which may reduce signal loss to improve electrical signal transmission characteristics.

According to exemplary embodiments of the present disclosure, a connection structure may be embedded in a printed circuit board using physical properties of an encapsulant and process characteristics without a further adhesive film. In addition, exemplary embodiments of the present disclosure provide a connection structure embedded substrate, mounted on a separate printed circuit board to be advantageous for improving a yield and thinning an overall substrate structure, and a substrate structure including the connection structure embedded substrate.

According to an aspect of the present disclosure, a connection structure embedded substrate includes: a printed circuit board including a plurality of first insulating layers and a plurality of first wiring layers, respectively disposed on or between the plurality of first insulating layers; and a connection structure disposed in the printed circuit board and including a plurality of internal insulating layers and a plurality of internal wiring layers, respectively disposed on or between the plurality of internal insulating layers. Among the plurality of internal wiring layers, an internal wiring layer disposed in one surface of the connection structure is in contact with one surface of a first insulating layer, among the plurality of first insulating layers.

According to an aspect of the present disclosure, a substrate structure includes: a first printed circuit board including a first insulating body, a plurality of first wiring layers disposed on at least one of an outside and an inside of the first insulating body, and a plurality of wiring vias connecting the plurality of first wiring layers to each other; a connection structure disposed in the printed circuit board and including an internal insulating body and a plurality of internal wiring layers disposed on at least one of an outside and an inside of the internal insulating body; and a second printed circuit board having one surface on which the first printed circuit board and including a second insulating body and a plurality of second wiring layers disposed on at least one of an outside and an inside of the second insulating body. Among the plurality of first wiring vias, at least one first wiring via has a shape tapered in a direction opposing a direction of at least another wiring via. Among the plurality of first wiring vias, at least one wiring via has an average diameter different from an average diameter of at least another first wiring via.

According to an aspect of the present disclosure, a substrate structure includes: a first printed circuit board including a plurality of first insulating layers and a plurality of first wiring layers, respectively disposed on or between the plurality of first insulating layers; and a connection structure disposed in the first printed circuit board and including a plurality of internal insulating layers and a plurality of internal wiring layers, respectively disposed on or between the plurality of internal insulating layers. One of the plurality of first insulating layers is in contact with one surface of the connection structure, and another one of the plurality of first insulating layers is in contact with another surface of the connection structure opposing the one surface and extends to cover a side surface of the connection structure. One via disposed in the one of the plurality of first insulating layers to connect to one of the plurality of internal wiring layers, and another via disposed in the another of the plurality of first insulating layers to connect to another of the plurality of internal wiring layers are tapered in opposing directions.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, embodiments of the present disclosure will be described as follows with reference to the attached drawings.

Figure 1:
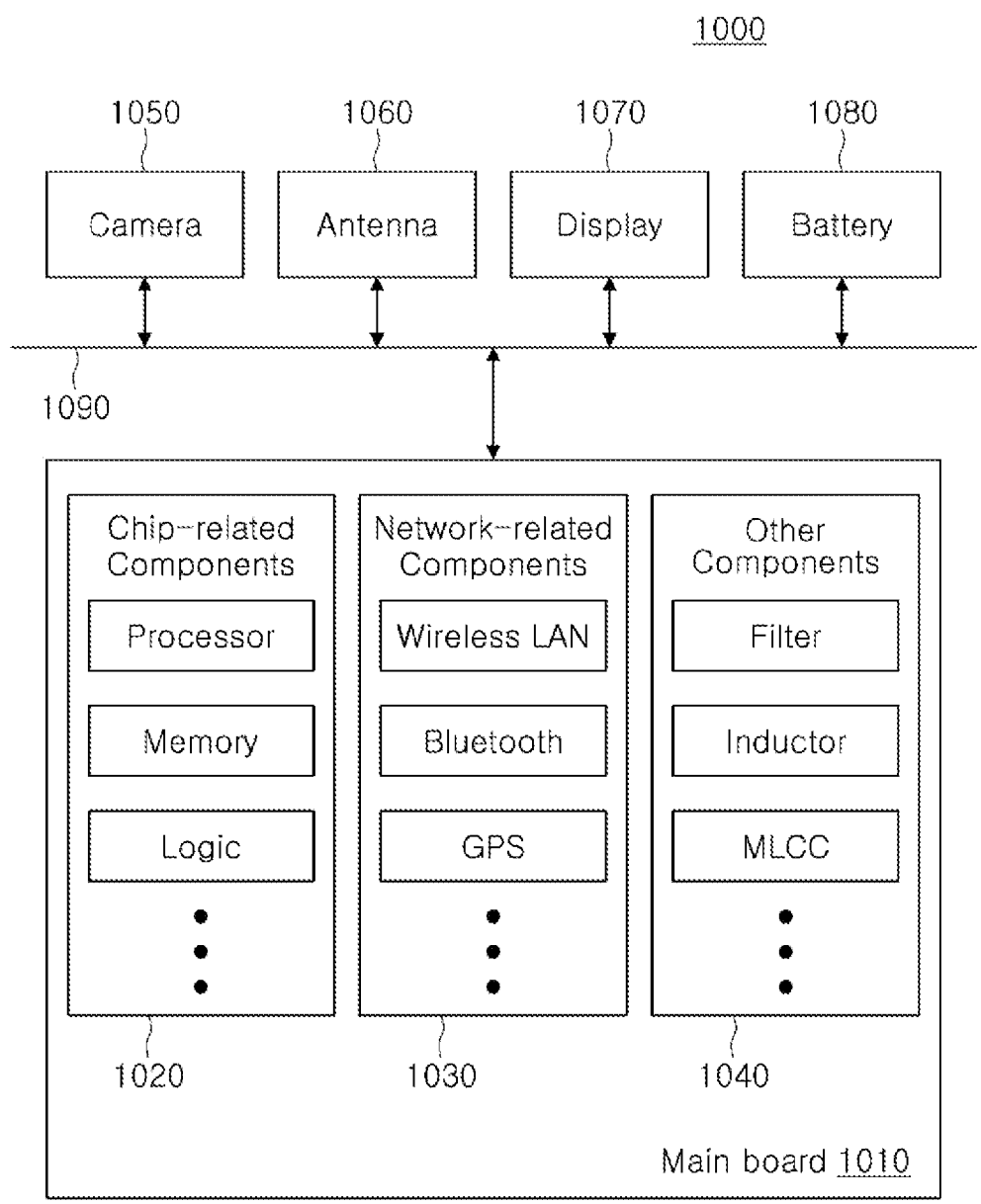
FIG. 1 is a schematic block diagram illustrating an example of an electronic device system according to an exemplary embodiment of the present disclosure.

FIG. 1 is a schematic block diagram illustrating an example of an electronic device system.

Referring to FIG. 1, an electronic device 1000 may accommodate a mainboard 1010 therein. The mainboard 1010 may include chip-related components 1020, network-related components 1030, other components 1040, and the like, physically or electrically connected thereto. These components may be connected to others to be described below to form various signal lines 1090.

The chip-related components 1020 may include a memory chip such as a volatile memory (for example, a dynamic random access memory (DRAM)), a nonvolatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip-related components 1020 are not limited thereto, and may also include other types of chip related components. Also, the chip-related components 1020 may be combined with each other. The chip-related components 1020 may have a package form including the above-described chip.

The network-related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network-related components 1030 are not limited thereto, and may also include a variety of other wireless or wired standards or protocols. Also, the network related components 1030 may be combined with the chip-related components 1020 to be provided in the form of a package.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. Also, other components 1040 may be combined with the chip-related components 1020 and/or the network-related components 1030 to be provided in the form of a package.

Depending on a type of the electronic device 1000, the electronic device 1000 may include other components that may or may not be physically or electrically connected to the mainboard 1010. These other components may include, for example, a camera module 1050, an antenna 1060, a display device 1070, and a battery 1080. However, an example embodiment thereof is not limited thereto, and these other components may include an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. Also to the above examples, other components used for various purposes depending on a type of electronic device 1000, or the like, may be included.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
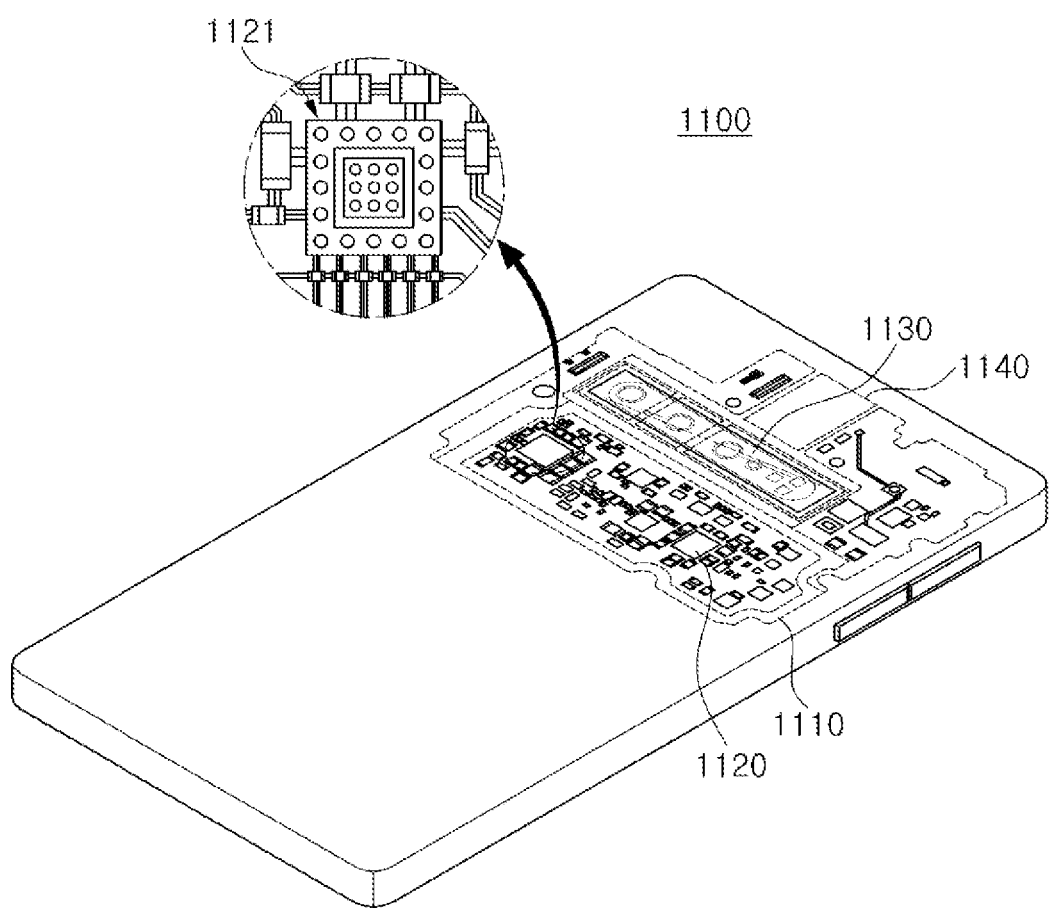
FIG. 2 is a schematic perspective view illustrating an example of an electronic device.

FIG. 2 is a schematic perspective view illustrating an example of an electronic device.

Referring to FIG. 2, the electronic device may be a smartphone 1100. A motherboard 1110 may be accommodated in a smartphone 1100, and various electronic components 1120 may be physically or electrically connected to the motherboard 1110. The camera module 1130 and/or the speaker 1140 may be accommodated therein. Some of the components 1120 may be the chip related components, such as a component package 1121, for example, but an example embodiment thereof is not limited thereto. The electronic device is not necessarily limited to the smartphone 1100, and may be other electronic devices as described above.

Figure 3:
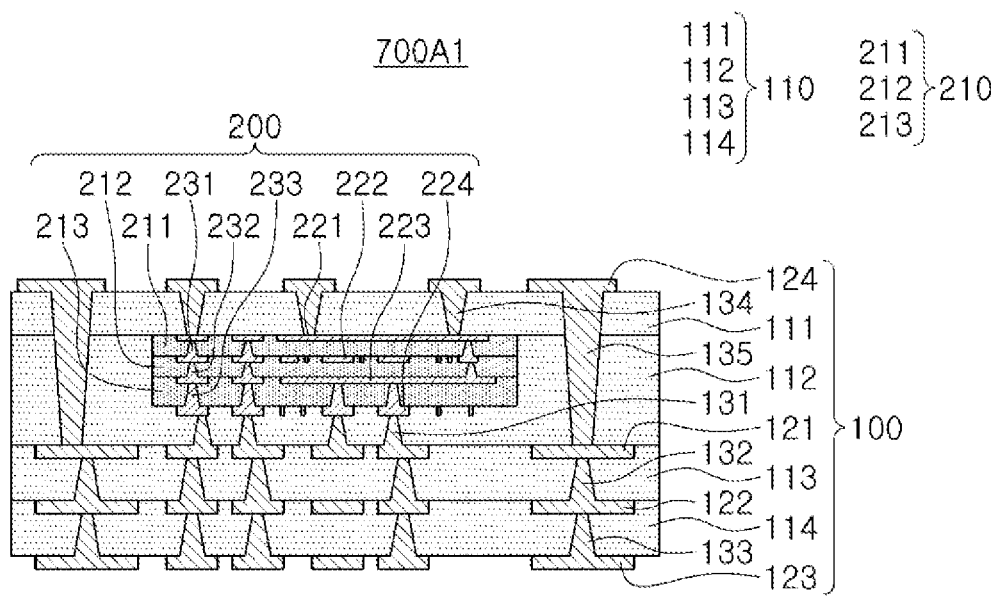
FIG. 3 is a cross-sectional view illustrating an example of a connection structure embedded substrate.

FIG. 3 is a cross-sectional view illustrating an example of a connection structure embedded substrate.

Referring to FIG. 3, a connection substrate embedded substrate 700A1 according to an exemplary embodiment may include a first printed circuit board 100 and a connection structure 200. The first printed circuit board 100 may include a first insulating body 110 including a plurality of first insulating layers 111, 112, 113, and 114, a plurality of first wiring layers 121, 122, 123, and 124 disposed in at least one of the inside and the outside of the insulating body 110, and a plurality of first wiring vias 131, 132, 133, and 134 and a first through-via 135 penetrating through at least a portion of the first insulating body 110. The connection structure 200 may include an internal insulating body 210 embedded in the first insulating body 110 of the first printed circuit board 100 and including a plurality of internal insulating layers 211, 212, and 213, a plurality of internal wiring layers 221, 222, 223, and 224 disposed in at least one of the outside and the inside of the internal insulating body 210, and a plurality of wiring vias 231, 232, and 233, respectively disposed in the internal insulating body 210. Each of the first insulating layers 111, 112, and 113 of the first insulating body 110 and each of the internal insulating layers 211, 212, and 213 of the internal insulating body 210 may include an insulating resin. The connection structure 200 may be disposed to be in contact with one surface of one first insulating layer 111, among the plurality of first insulating layers 111, 112, 113, and 114.

As described above, the connection structure embedded structure 700A1 according to an example embodiment may have a structure in which the connection structure 200 is embedded in the first insulating body 110 of the first printed circuit board 100. In addition, the internal insulating body 210 of the connection structure 200 may be in contact with the first insulating layer 111, and the connection structure 200 may be bonded to the first printed circuit board 100 without a separate adhesive. Accordingly, issues in a printed circuit board, in which the conventional embedded multi-die interconnect bridge (EMIB) described above is embedded, may be addressed.

One surface of the internal insulating body 210 of the connection structure 200 may be in contact with one surface of the first insulating layer 111 of the first printed circuit board 100. As will be described in a subsequent process, the first insulating layer 111 may be formed of an insulating material including an organic material, and the internal insulating body 210 of the connection structure 200 may also include an organic material. Therefore, when the first insulating layer 111 is in an uncured or semicured state, the connection structure 200 may be bonded to the first insulating layer 111 and then cured to fix the connection structure 200 to first insulating layer 111.

One of the plurality of internal wiring layers 221, 222, 223, and 224 may be embedded in one surface of the connection structure 200. For example, the internal wiring layer 221 may be embedded in one surface of one internal insulating layer 211 of the internal insulating body 210 of the connection structure 200, and the one surface thereof may be exposed to one surface of the connection structure 200. The exposed internal wiring layer 221 may be in contact with the one surface of the first insulating layer 111.

The one surface of the first insulating layer 111 may have a step in a region in contact with the connection structure 200. For example, one surface of the first insulating layer 111 may have a shape in which at least a portion of the connection structure 200 is recessed inwardly of the first insulating layer 111 from one surface of the first insulating layer 111, but example embodiments are limited thereto.

The connection structure 200 may include a fine circuit, as compared with the first printed circuit board 100. In the present disclosure, the meaning of "including a fine circuit" may refer to relative meaning. For example, the meaning of "including a fine circuit" may refer to at least one case, among cases in which the plurality of internal wiring layers 221, 222, 223, and 224 of the connection structure 200 have a line width, a pitch, and a space smaller than those of the plurality of first wiring layers 121, 122, 123, and 124 of the first printed circuit board 100. The meaning of the line width, the pitch, and the space will be described later.

Each of the plurality of first wiring layers and the plurality of internal wiring layers 121, 122, 123, 124, 221, 222, and 223 may include a conductor pattern, and the plurality of the internal wiring layers 221, 222, 223, and 224 in the connection structure 200 may have a relatively smaller line width than the plurality of first wiring layers 121, 122, 123, and 124 of the first printed circuit board 100.

Each of the plurality of first wiring layers and the plurality of internal wiring layers 121, 122, 123, 124, 221, 222, and 223 may include a pad or land serving to be connected to an upper or lower via. In the present disclosure, the line width may refer to a width in a direction orthogonal to a direction in which a conductor pattern extends from one pad and/or one land to another pad and/or another land in each wiring layer. In addition, in the present disclosure, line widths of the plurality of first wiring layers 121, 122, 123, and 124 and the plurality of internal wiring layers 221, 222, 223, and 224 may refer to an average value of line widths of each conductor pattern, rather than a line width of each of conductor patterns in one wiring layer. For example, the sentence "the plurality of internal wiring layers 221, 222, 223, and 224 of the connection structure 200 have a relatively smaller line width than the plurality of first wiring layers 121, 122, 123, and 124 of the first printed circuit board 100" may mean that an average line width value of each conductor pattern in the plurality of internal wiring layers 221, 222, 223, and 224 may be smaller than an average line width value of each conductor pattern in the plurality of first wiring layers 121, 122, 123, and 124.

For example, an average line width of each conductor pattern in the plurality of first wiring layers 121, 122, 123, and 124 of the first printed circuit board 100 is calculated and then an overall average line width of the plurality of first wiring layers 121, 122, 123, and 124 is calculated to be referred to as a first line width. In addition, an average line width of each conductor pattern in the plurality of internal wiring layers 221, 222, 223, and 224 of the connection structure 200 is calculated and then an overall average line width of the plurality of internal wiring layers 221, 222, 223, and 224 is calculated to be referred to as a second line width. In this case, the first line width may be greater than the second line width.

Each of the plurality of first wiring layers and the plurality of internal wiring layers 121, 122, 123, 124, 221, 222, and 223 may include a conductor pattern, and the plurality of internal wiring layers 221, 222, 223, and 224 in the connection structure 200 may have a relatively fine pitch, as compared with the plurality of first wiring layers 121, 122, 123, and 124 of the first printed circuit board 100.

The term "pitch" may refer to a distance from a center of one conductor pattern to a center of another adjacent conductor pattern in respective wiring layers disposed on the same layer. In addition, in the present disclosure, a pitch of the plurality of first wiring layers 121, 122, 123, and 124 and the plurality of internal wiring layers 221, 222, 223, and 224 may refer to an average pitch, rather than a pitch of each wiring layer. For example, the sentence "the plurality of internal wiring layers 221, 222, 223, and 224 of the connection structure 200 have a relatively fine pitch, as compared with the plurality of first wiring layers 121, 122, 123, and 124 of the first printed circuit board 100" means that a value calculated by averaging values of respective pitches in the plurality of internal wiring layers 221, 222, 223, and 224 may be smaller than a value calculated by averaging values of respective pitches in the plurality of first wiring layer 121, 122, 123, and 124.

For example, an average pitch of each of the plurality of first wiring layers 121, 122, 123, and 124 of the first printed circuit board 100 is calculated, and then an overall average pitch of the plurality of first wiring layers 121, 122, 123, and 124 are calculated to be referred to as a first pitch. In addition, an average pitch of each of the plurality of internal wiring layers 221, 222, 223, and 224 of the connection structure is calculated, and then an overall average pitch of the plurality of internal wiring layers 221, 222, 223, and 224 is calculated to be referred to as a second pitch. In this case, the first pitch may be greater than the second pitch.

When an average space between the plurality of first wiring layers 121, 122, 123, and 124 of the first printed circuit board 100 is referred to as a first space and an average space between the plurality of internal wiring layers 221, 222, 223, and 224 of the connection structure is referred to as a second space, the first space may be greater than the second space. In the present disclosure, the term "space" may refer to an interlayer space in a lamination direction between wiring layers in the plurality of first wiring layers 121, 122, 123, and 124 and the plurality of internal wiring layers 221, 222, 223, and 224, or may refer to an average value of distances from a conductor pattern to another adjacent conductor pattern on the same layer in each of the plurality of first wiring layers 121, 122, 123, and 124 and the plurality of internal wiring layers 221, 222, 223, and 224.

For example, in the present disclosure, the term "space" may refer to a spacing distance between one conductor pattern and another conductor pattern, and may refer to an average space, rather than an individual space.

As an example, an average value of spaces of the plurality of first wiring layers 121, 122, 123, 124 in each interlayer lamination direction may be greater than an average value of spaces of the plurality of internal wiring layers 221, 222, 223, and 224 in each interlayer lamination direction.

As another example, an average value of spaces between adjacent conductor patterns in each of the plurality of first wiring layers 121, 122, 123, and 124 is calculated, and then an average value of average values between spaces of adjacent conductor patterns in respective layers is calculated to be referred to as a first space. In addition, an average value of spaces between adjacent conductor patterns in each of the plurality of internal wiring layers 221, 222, 223, and 224, and then an average value of average values of spaces between adjacent conductor patterns in respective layers is calculated to be referred to as a second space. In this case, the first space may be greater than the second space.

In the first insulating body 110, a first through-via 135 may be formed to penetrate through at least two layers, among the plurality of first insulating layers 111, 112, 113, and 114, and to be electrically connected to at least a portion of the first wiring layers 121, 122, 123, and 124. For example, the first through-via 135 may penetrate through at least a portion of each of the plurality of first insulating layers 111 and 112. However, the disposition of the first through-via 135 is not limited thereto, and the first through-via 135 may penetrate through more layers in the first insulating body 110. Since the first through-via 135 is disposed to penetrate through two or more layers of the first insulating layers 111 and 112, generation of resistance and noise during transmission of an electrical signal may be reduced to prevent signal loss and to increase a signal transmission speed, as compared with the case in which a pad or an additional wiring layers are disposed therebetween. In addition, an electrical signal transmission path may be further reduced to stably improve power integrity characteristics, and the like.

Hereinafter, the configuration of the connection structure embedded substrate 700A1 will be described in more detail with reference to accompanying drawings.

In the connection structure embedded substrate 700A1 according to an exemplary embodiment illustrated in FIG. 3, the first printed circuit board 100 may include a first insulating body 110 including a plurality of first insulating layers 111, 112, 113, and 114, a plurality of first wiring layers 121, 122, 123, and 124 disposed on or between the plurality of first insulating layers 111, 112, 113, and 114, first wiring vias 131, 132, 133, and 134 penetrating through at least a portion of the plurality of first insulating layers 111, 112, 113, and 114, and a first through-via 135 penetrating through at least two layers, among the plurality of first insulating layers 111, 112, 113, and 114. The plurality of first wiring layers 121, 122, 123, and 124 may include a conductor pattern, and first wiring vias 131, 132, 133, and 134 and the first through-vias 135 may electrically connect conductor patterns of the plurality of first wiring layers 121, 122, 123, and 124 to each other.

The printed circuit board 100 may have a coreless structure having no core layer dude to a process to be described later. Hereinafter, a coreless structure and a process thereof will be described in the present disclosure, but a core substrate structure having a core layer may also be applied to the present disclosure.

The printed circuit board 100 may include a 1-1-th insulating layer 111, a 1-2-th insulating layer 112 disposed on one surface of the 1-1-th insulating layer 111, a 1-4-th wiring layer 124 disposed on the other surface of the 1-1-th insulating layer 111, a 1-1-th wiring layer 121 disposed on the 1-2-th insulating layer 112, a first through-via 135 penetrating through at least a portion of each of the 1-1-th and 1-2-th insulating layers 111 and 112 and connecting the 1-1-th wiring layer 121 and the 1-4-th wiring layer 124 to each other, a 1-3-th insulating layer 113 disposed on the 1-2-th insulating layer to cover the 1-1-th wiring layer 121, a 1-2-th wiring layer 122 disposed on the 1-3-th insulating layer 113, a 1-1-th wiring via 132 penetrating through at least a portion of the 1-3-th insulating layer 113 and connecting the 1-1-th wiring layer 121 and the 1-2-th wiring layer 122 to each other, a 1-4-th insulating layer 114 disposed on the 1-3-th insulating layer 113 to cover the 1-2-th insulating layer 122, a 1-3-th wiring layer 123 disposed on the 1-4-th insulating layer 114, a 1-3-th wiring via 133 penetrating through at least a portion of the 1-4-th insulating layer 114 and connecting the 1-2-th wiring layer 112 and the 1-3-th wiring layer 113 to each other, a 1-4-th wiring via 134 penetrating through at least a portion of the 1-1-th insulating layer 111 and connected to the 1-4-th wiring layer 124, and a first wiring via 131 penetrating through at least a portion of the internal insulating layer 112 and connected to the 1-1-th wiring layer 121.

An insulating material, including an organic material, may be used as a material for the plurality of first insulating layers 111, 112, 113, and 114. The insulating material may be a photosensitive insulating material such as a photoimageable dielectric (PID), a thermosetting resin such as an epoxy resin or a thermoplastic resin such as a polyimide resin, or a material including a reinforcing material such as an inorganic filler such as silica and/or glass fiber, such as prepreg, Ajinomoto build-up film (ABF), or the like. The number of the plurality of first insulating layers 111, 112, 113, and 114 may be greater or less than the example illustrated in the drawing. Boundaries between the plurality of first insulating layers 111, 112, 113, and 114 may be distinct or indistinct.

The plurality of first insulating layers 111, 112, 113, and 114 may include a material having fluidity in a high-temperature environment, and may have adhesiveness in a semicured or uncured state. In addition, the plurality of first insulating layers 111, 112, 113, and 114 may include an organic material having a low dielectric dissipation factor Df and a low dielectric constant Dk to have fluidity in the state before being completely cured, as compared with the case of containing an inorganic material such as silicon (Si), or the like.

As will be described later, one surface of the connection structure 200 may be disposed to be in contact with one surface of one first insulating layer 111, among the plurality of first insulating layers 111, 112, 113, and 114, and then the other first insulating layers 112, 113, and 114 may be built up. Therefore, the additionally built-up first insulating layers 112, 113, and 114 may have a relatively high modulus, as compared with the first insulating layer 111, to secure rigidity of the connection structure embedded substrate 700A1 and to control warpage thereof. Accordingly, the first insulating layers 112, 113, and 114 may be relatively great brittleness, as compared with the first insulating layer 111, so that it may be advantageous to secure the rigidity of the connection structure embedded substrate 700A1.

A metal material may be used as a material for the plurality of first wiring layers 121, 122, 123, and 124. The metal material may be copper (Cu), aluminum (Al), silver (Ag), tin (Sn), gold (Au), nickel (Ni), lead (Pb), titanium (Ti), or alloys thereof. Each of the plurality of first wiring layers 121, 122, 123, and 124 may perform various functions depending on a design. For example, the plurality of first wiring layers 121, 122, 123, and 124 may include a ground pattern, a power pattern, a signal pattern, and the like. Each of these patterns may have a line shape, a plane shape, or a pad shape. The plurality of first wiring layers 121, 122, 123, and 124 may be formed by a plating process such as an additive process (AP), a semi-AP (SAP), a modified SAP (MSAP), a tenting (TT) process, or the like, and thus, may include a seed layer, an electroless plating layer, and an electrolytic plating layer formed based on the seed layer. When the plurality of first wiring layers 121, 122, 123, and 124 are provided in the form of a resin coated copper (RCC), they may further include a primer copper foil, as necessary. The number of the plurality of first wiring layers 121, 122, 123, and 124 may be greater or less than the example illustrated in the drawing.

A metal material may also be used as a material for the plurality of first wiring vias 131, 132, 133, and 134. The metal material may be copper (Cu), aluminum (Al), silver (Ag), Tin (Sn), gold (Au), nickel (Ni), lead (Pb), titanium (Ti), or alloys thereof. The plurality of first wiring vias 131, 132, 133, and 134 may include a signal connection via, a ground connection via, a power connection via, and the like, depending on a design. Each of the plurality of first wiring vias 131, 132, 133, and 134 may be entirely filled with a metal material, or may be a wiring via in which a metal material is formed along a wall surface of a via hole. Alternatively, each of the plurality of first wiring vias 131, 132, 133, and 134 may have a form in which a metal material is formed on a wall surface of a via hole and a separate plug material is filled. Each of the plurality of first wiring vias 131, 132, 133, and 134 may have a tapered shape. The term "tapered shape" may refer to a shape in which a width of a wiring via tends to be narrowed from one end toward the other end thereof. However, exemplary embodiments are not limited thereto, and widths of one end and the other end of a wiring via may be different from each other. The plurality of first via layers 131, 132, 133, and 134 may be formed by a plating process such as AP, SAP, MSAP, TT, or the like, and thus, may include a seed layer, an electroless plating layer, and an electroplating layer formed based on the seed layer. The number of the plurality of first via layers 131 and 132 may be greater or less than the example illustrated in the drawing.

A metal material may also be used as a material for the through-via 135. The metal material may be copper (Cu), aluminum (Al), silver (Ag), Tin (Sn), gold (Au), nickel (Ni), lead (Pb), titanium (Ti), or alloys thereof. The first through-via 135 may include a signal connection via, a ground connection via, a power connection via, or the like, depending on a design. A via in the through-via 135 may be entirely filled with a metal material, or may be a via in which a metal material is formed along a wall surface of a via hole. Alternatively, a via in the through-via 135 may have a form in which a metal material is formed on a wall surface of a via hole and a separate plug material is filled. The through-via 135 may be formed by a plating process such as AP, SAP, MSAP, TT, or the like, and thus, may include a seed layer, an electroless plating layer, and an electroplating layer formed based on the seed layer.

Unlike each of the plurality of first wiring vias 131, 132, 133, and 134, the first through-via 135 may penetrate through two or more insulating layers. Referring to FIG. 3, the first through-via 135 may penetrate through at least a portion of each of the 1-1-th and 1-2-th insulating layers 111 and 112. The number of first insulating layers, through which the first through-via 135 penetrates, may be greater or less than the example illustrated in the drawing. For example, the first through-via 135 may be formed to further penetrate through the 1-3-th insulating layer 113. In this case, the first through-via 135 may connect the 1-2-th wiring layer 122 and the 1-4-th wiring layer 124 to each other.

The first through-via 135 may have a shape tapered in a direction opposing that of at least a portion of the plurality of first wiring vias 131, 132, 133, and 134. Referring to FIG. 3, the first through-via 135 may have a shape tapered in a direction opposing the 1-1-th to 1-3-th wiring vias 131, 132, and 133. On the other hand, the first through-via 135 may be tapered in the same direction as the 1-4-th wiring via 134.

For example, the first through-via 135 may have a shape tapered in a direction opposing the plurality of internal wiring vias 231, 232, and 233. Among the plurality of first wiring vias 131, 132, 133, and 134, one or more wiring vias 131, 132, and 133 may have a shape tapered in the same direction as the plurality of internal wiring vias 231, 232, and 233. Among the plurality of first wiring vias 131, 132, 133, and 134, at least one first wiring via 134 may have a shape tapered in a direction opposing the plurality of internal wiring vias 231, 232, and 233.

The first through-via 135 may have a structure having an average diameter and/or an average width different from an average diameter and/or an average width of the plurality of first wiring vias 131, 132, 133 and 134. For example, as illustrated in FIG. 3, the first through-via 135 may have a larger average width and/or a larger average diameter of a cross-section than each of the plurality of first wiring vias 131, 132, 133, and 134.

The first through-via 135 may have a structure having a different height from that of the plurality of layers of the first wiring vias 131, 132, 133, and 134. For example, as illustrated in FIG. 3, the first through-via 135 may penetrate through the plurality of first insulating layers, so that the first through-via 135 may have a greater height than each of the plurality of first wiring vias 131, 132, 133, and 134.

The connection structure 200 may include an internal insulating body 210 including a plurality of internal insulating layers 211, 212, and 213, a plurality of internal wiring layers 221, 222, 223, and 224, and a plurality of wiring vias 231, 232, and 233. Each of the plurality of first wiring layers 221, 222, and 223 may include a conductor pattern, and the plurality of internal wiring vias 231, 232, and 233 may electrically connect the conductor patterns to each other. The connection structure 200 may be in the form of a coreless substrate. For example, the connection structure 200 may include a first internal insulating layer 211, a first internal wiring layer 221 embedded in one surface of the first internal insulating layer 211, a second internal wiring layer 222 disposed on the other surface of the first internal insulating layer 211, a first internal wiring via 231 penetrating through the first internal insulating layer 211 and connecting the first internal wiring layer 221 and the second internal wiring layer 222 to each other, a second internal insulating layer 212 disposed on the other surface of the first internal insulating layer 211 to cover the second internal wiring layer 222, a third internal wiring layer 223 disposed on the second internal insulating layer 212, a second internal wiring via 232 penetrating through the second internal insulating layer 212 and connecting the second internal wiring layer 222 and the third internal wiring layer 223 to each other, a third internal insulating layer 213 disposed on the second internal insulating layer 212 to cover the third internal wiring layer 223, a fourth internal wiring layer 224 disposed on the third internal insulating layer 213, and a third internal wiring via 233 penetrating through the third internal insulating layer 213 and connecting the third internal wiring layer 223 and the fourth internal wiring layer 224 to each other.

The connection structure 200 may be fixed through a curing treatment after the internal insulating body 210 is disposed, in an uncured or semicured state, on the 1-1-th insulating layer 111 disposed on a carrier member 800, as will be described later. Therefore, the connection structure 200 may be disposed on one surface of the 1-1-th insulating layer 111 without a separate adhesive.

An insulating material, including an organic material, may be used as a material for the plurality of internal insulating layers 211, 212, and 213. The insulating material may be a photosensitive insulating material such as a photoimageable dielectric (PID), a thermosetting resin such as an epoxy resin or a thermoplastic resin such as a polyimide resin, or a material including a reinforcing material such as an inorganic filler such as silica and/or glass fiber, such as prepreg, Ajinomoto build-up film (ABF), or the like. The number of the plurality of internal insulating layers 211, 212, and 213 may be greater or less than the example illustrated in the drawing. Boundaries between the plurality of internal insulating layers 211, 212, and 213 may be distinct or indistinct.

Since the insulating material including the organic material may be used as a material for the plurality of internal insulating layers 211, 212, and 213 of the connection structure 200, a shape of each of the plurality of internal insulating layers 211, 212, and 213 may be adjusted and controlled in a semicured or uncured state, as necessary. Accordingly, the connection structure 200 may be manufactured in various shapes. For example, when viewed from above, the connection structure 200 does not need to have a quadrangular shape and may have a triangular shape, a circular shape, a hollow closed-loop shape, a partially cut shape, or the like. Thus, the degree of freedom in design of the entire structure 200 and the connection structure embedded substrate 700A1 may be secured, and a shape appropriate thereto may be designed, as necessary.

Among the plurality of internal wiring layers 221, 222, 223, and 224, the first internal wiring layer 221 may be embedded in one surface of the first internal insulating layer 211, and the one surface of the first internal insulating layer 211 may be exposed outwardly from one surface of the connection structure 200. In addition, the exposed one surface of the first internal wiring layer 221 may have a structure in contact with one surface of the 1-1-th insulating layer 111. This is because the connection structure embedded substrate 700A1 according to the present disclosure is manufactured in a build-up manner by a process to be described later using the carrier member 800. The first internal wiring layer 221 may be electrically connected to the 1-4-th wiring layer 124 through the 1-4-th wiring via 134 penetrating through the 1-1-th insulating layer 111.

Among the plurality of internal wiring layers 221, 222, 223, and 224, the fourth internal wiring layer 224 may be disposed to protrude upwardly of the other surface of the connection structure 200. Accordingly, at least a portion of the fourth internal wiring layer 224 may be covered with the 1-2-th insulating layer 112, and may be electrically connected to the 1-1-th wiring layer 121 through the 1-3-th wiring via 131 penetrating through the 1-2-th insulating layer 112.

A metal material may be used as a material for the plurality of internal wiring layers 221, 222, 223, and 224. The metal material may be copper (Cu), aluminum (Al), silver (Ag), tin (Sn), gold (Au), nickel (Ni), lead (Pb), titanium (Ti), or alloys thereof. Each of the plurality of internal wiring layers 221, 222, 223, and 224 may perform various functions depending on a design. For example, the plurality of first wiring layers 121, 122, 123, and 124 may include a ground pattern, a power pattern, a signal pattern, and the like. Each of these patterns may have a line shape, a plane shape, or a pad shape. The plurality of internal wiring layers 221, 222, 223, and 224 may be formed by a plating process such as AP, SAP, MSAP, TT, or the like, and thus, may include a seed layer, an electroless plating layer, and an electrolytic plating layer formed based on the seed layer. When the plurality of internal wiring layers 221, 222, 223, and 224 are provided in the form of a resin coated copper (RCC), they may further include a primer copper foil. The number of the plurality of internal wiring layers 221, 222, 223, and 224 may be greater or less than the example illustrated in the drawing.

A metal material may also be used as a material for the plurality of internal wiring vias 231, 232, and 233. The metal material may be copper (Cu), aluminum (Al), silver (Ag), tin (Sn), gold (Au), nickel (Ni), lead (Pb), titanium (Ti), or alloys thereof. The plurality of internal wiring vias 231, 232, and 233 may also include a signal connection via, a ground connection via, a power connection via, and the like, depending on a design. Each of the plurality of internal wiring vias 231, 232, and 233 may be entirely filled with a metal material, or may be a wiring via in which a metal material is formed along a wall surface of a via hole. Alternatively, each of the plurality of internal wiring vias 231, 232, and 233 may have a form in which a metal material is formed on a wall surface of a via hole and a separate plug material is filled. Each of the plurality of internal wiring vias 231, 232, and 233 may have a tapered shape. The plurality of internal wiring vias 231, 232, and 233 may be formed by a plating process such as AP, SAP, MSAP, TT, or the like, and thus, may include a seed layer, an electroless plating layer, and an electrolytic plating layer formed based on the seed layer. The number of the plurality of internal wiring vias 231, 232, and 233 may be greater or less than the example illustrated in the drawing.

The plurality of layers of internal wiring vias 231, 232, and 233 may have a shape tapered in a direction opposing the first through-via 135 and the 1-4-th wiring via 134. Accordingly, the 1-1-th to 1-3-th wiring vias 131, 132, and 133 may have a shape tapered in the same direction.

As described above, the plurality of internal wiring layers 221, 222, 223, and 224 of the connection structure 200 may include a relatively fine circuit pattern, as compared with the plurality of first wiring layers 121, 122, 123, and 124 of the first printed circuit board 100. In the present disclosure, the meaning of "including a fine circuit" may refer to relative meaning. For example, the meaning of "including a fine circuit" may refer to at least one case, among cases in which the plurality of internal wiring layers 221, 222, 223, and 224 of the connection structure 200 have a line width, a pitch, and a space smaller than those of the plurality of first wiring layers 121, 122, 123, and 124 of the first printed circuit board 100.

The same descriptions as in the above-described example embodiment may be applied to the overlapping elements, so that detailed descriptions thereof will be omitted.

FIGS. 4 to 10 are schematic process flow diagrams illustrating an example of manufacturing the connection structure embedded substrate of FIG. 3.

Figure 4:
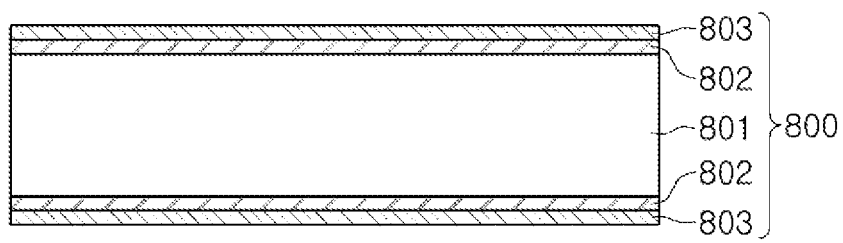
FIGS. 4 to 10 are schematic process flow diagrams illustrating an example of manufacturing the connection structure embedded substrate of FIG. 3.

Referring to FIG. 4, a carrier member 800 may be prepared. The carrier member 800 may include a carrier core 801, first copper foil layers 802, respectively disposed on one surface and the other surface of the carrier core 801, and a second copper foil layer 803 disposed on the first copper foil layer 802. The carrier member 800 may be a conventional detachable carrier film.

Figure 5:
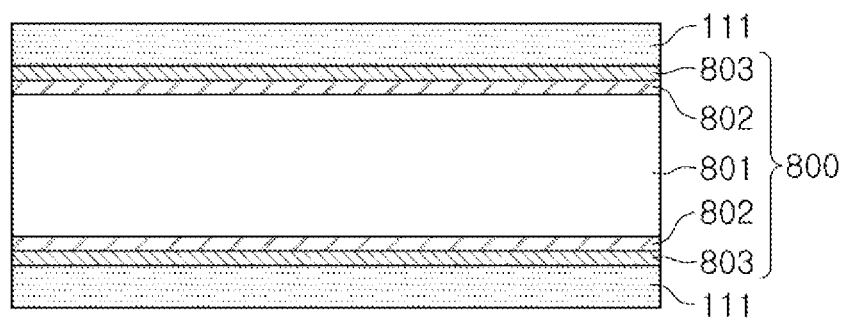

Referring to FIG. 5, 1-1-th insulating layers 111 including an organic material may be disposed on one surface and the other surface of the carrier member 800, respectively. In the present disclosure, a double-sided build-up process is disclosed, but it will be understood that a single-sided build-up process may be applied, as necessary.

The 1-1-th insulating layer 111 may be disposed on the carrier member 800 in an uncured or semicured state. Accordingly, the 1-1-th insulating layer 111 may have adhesion, as compared with a state after subjected to a curing treatment.

Figure 6:
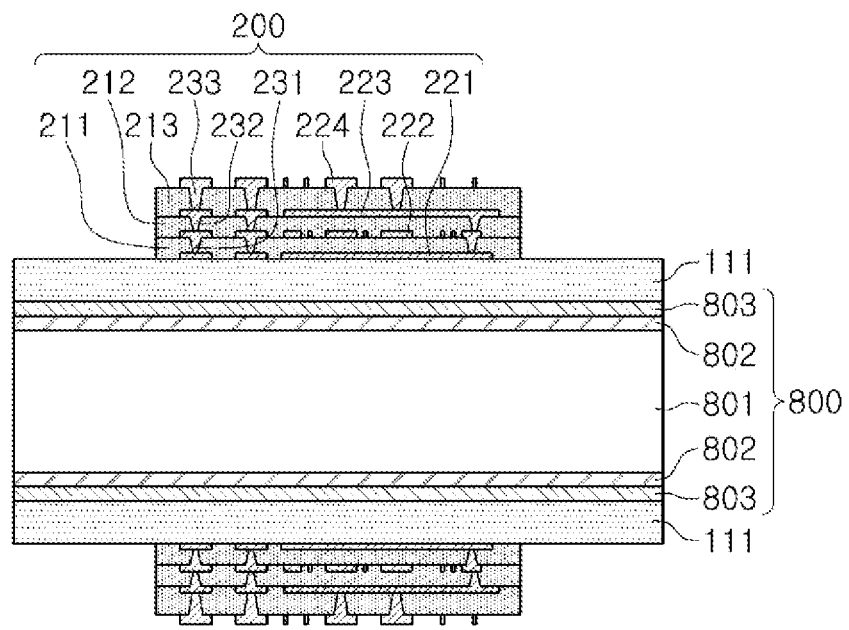

Referring to FIG. 6, a connection structure 200 may be disposed on the 1-1-th insulating layer 111. In this case, one surface of the connection structure 200 may be brought into contact with one surface of the 1-1-th insulating layer 111. Specifically, one surface of each of the first internal insulating layer 211 and the first internal wiring layer 221 may be disposed to be in contact with one surface of the 1-1-th insulating layer 111. When the connection structure 200 is disposed on the 1-1-th insulating layer 111, the internal insulating body 210 may also be in an uncured or semicured state.

When the connection structure 200 is disposed on the 1-1-th insulating layer 111, a step may be formed in a region, in contact with the connection structure 200, of one surface of the 1-1-th insulating layer because the 1-1-th insulating layer 111 is in an uncured or semicured state. For example, the connection structure 200 may have a structure in which at least a portion is embedded in the 1-1-th insulating layer 111 and the 1-1-th insulating layer 111 is recessed in a shape corresponding to a shape of the connection structure 200.

Then, the connection structure 200 may be attached to the 1-1-th insulating layer 111 through a curing process of curing the 1-1-th insulating layer 111 and the internal insulating body 210 of the connection structure 200. Accordingly, an attaching process of a separate adhesive layer or a separate adhesive may be omitted to simplify the process and to reduce cost consumption.

Figure 7:
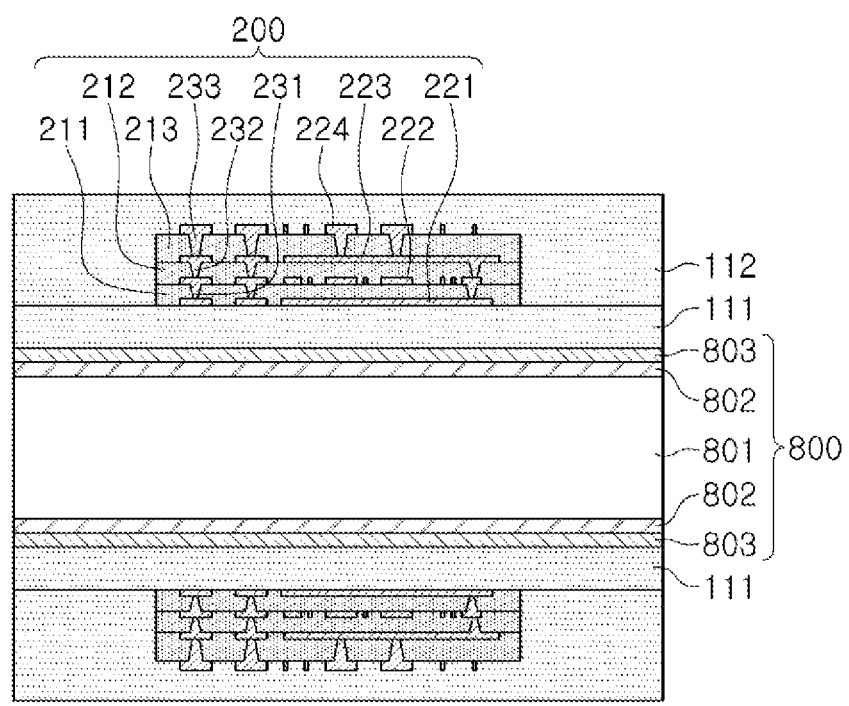
Figure 8:
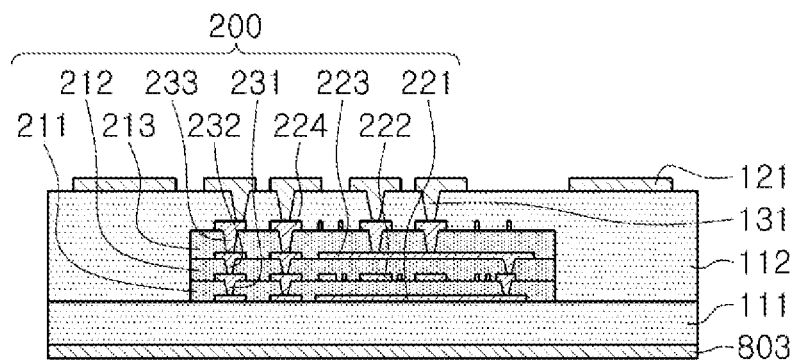

Referring to FIGS. 7 and 8, a 1-2-th insulating layer 112 may be disposed on the 1-1-th insulating layer 111 to cover the connection structure 200. Similarly to the 1-1-th insulating layer 111, the 2-1-th insulating layer 112 may include an organic insulating material and may be cured through a curing treatment after covering the connection structure in an uncured or semicured state. Thus, the connection structure 200 may be covered with the 1-1-th insulating layer 111 and the 1-2-th insulating layer 112 and may be embedded in the first insulating body 110.

In addition, referring to FIG. 8, a precursor of a connection structure embedded substrate 700A1 may be separated from a carrier core 801 and a first copper coil layer 802 through a process of separating the first copper coil layer 802 and a second copper foil layer 803 of the carrier member 800 from each other. In this case, the second copper foil layer 803 of the carrier member 800 may remain on the other surface of the 1-1-th insulating layer 111, and then, a 1-1-th wiring layer 121 and a 1-1-th wiring via 131 may be disposed.

Figure 9:
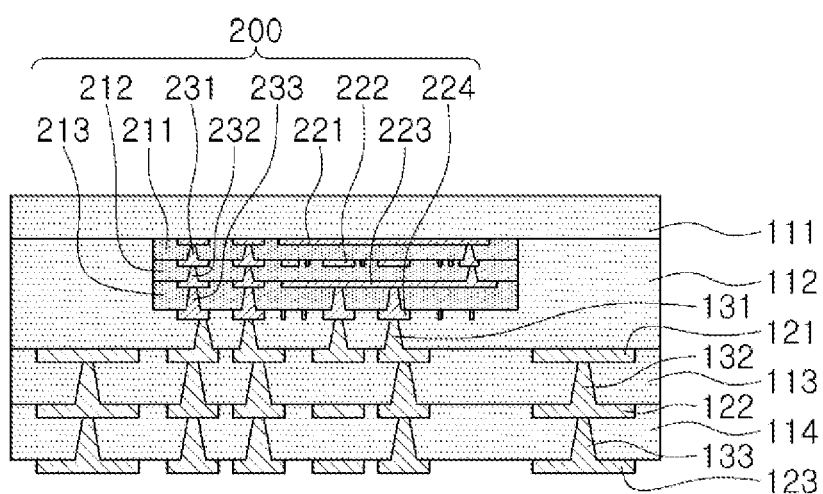

Referring to FIG. 9, a plurality of first insulating layers 113 and 114, a plurality of first wiring layers 122 and 123, and a plurality of first wiring vias 132 and 133 may be additionally disposed. The number of insulating layers, the number of wiring layers, and the number of wiring vias may be greater or less than the example illustrated in the drawing. The plurality of wiring vias 131, 132, and 133 described above may be formed by processing a via hole using a mechanical drilling process such as a laser drilling process using $CO_2$, YAG laser, or the like, or a blasting process, or the like, and then filling the via hole with a plating material through a plating process or a paste process. However, exemplary embodiments are not limited thereto, and the plurality of wiring vias 131, 132, and 133 may be formed using a method including forming a plating layer within a via using a plating resist, covering an insulating layer, and polishing a portion of the insulating layer to expose the plating layer.

Figure 10:
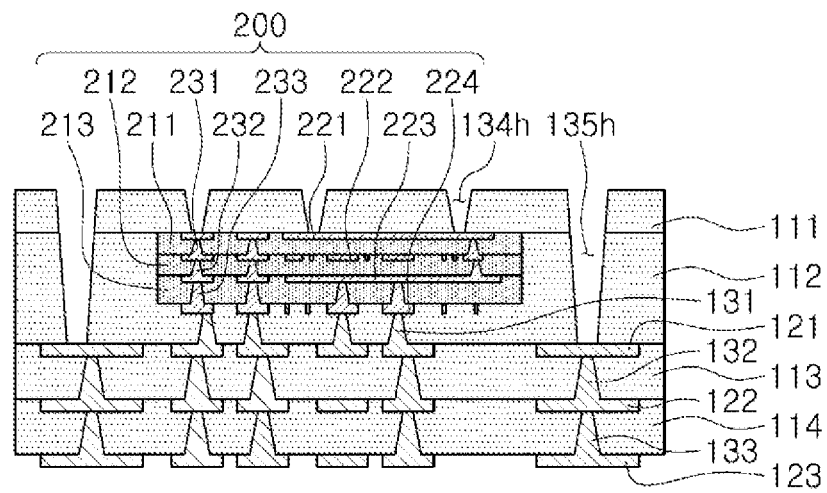

Referring to FIG. 10, a through-via hole 135*h* may be performed to penetrate through a portion of each of the 1-1-th insulating layer 111 and the 1-2-th insulating layer 112, and a 1-4-th wiring via hole 134*h* may be formed to penetrate through the 1-1-th insulating layer 111. The through-via hole 135*h* and the 1-4-th wiring via hole 134*h* may also be formed using the above-described mechanical drilling or blasting process, but exemplary embodiments are not limited thereto.

Then, the through-via hole 135*h* and the 1-4-th wiring via hole 134*h* of FIG. 10 may be filled with a plating material through a plating process or a paste process to form a first through-via 135 and a 1-4-th wiring via 134. Thus, a structure of the connection structure embedded substrate 700A1 of FIG. 3 may be manufactured.

A method of processing the through-via hole 135*h* and the first-4 wiring via hole 134*h* and filling the through-via hole 135*h* and the first-4 wiring via hole 134*h* with a conductor is not limited to the above-described method. For example, the through-via hole 135*h* and the first-4 wiring via hole 134*h* may be formed by forming a plating layer within a via using a plating resist, rather than processing a via hole, covering an insulating layer, and polishing a portion of the insulating layer to expose the plating layer.

Although not illustrated, a passivation layer may be additionally disposed on an outermost layer of the connection structure embedded substrate 700A1 to protect a wiring layer of the outermost layer from physical and chemical damage.

The same descriptions as in the above-described example embodiment may be applied to the overlapping elements, so that detailed descriptions thereof will be omitted.

Figure 11:
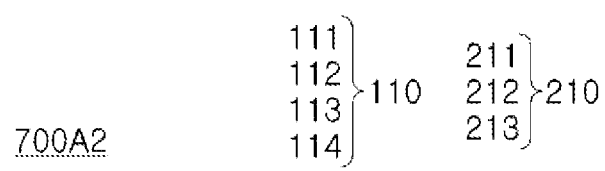
FIG. 11 is a schematic cross-sectional view illustrating a modified example of the connection structure embedded substrate of FIG. 3.
Figure 11:
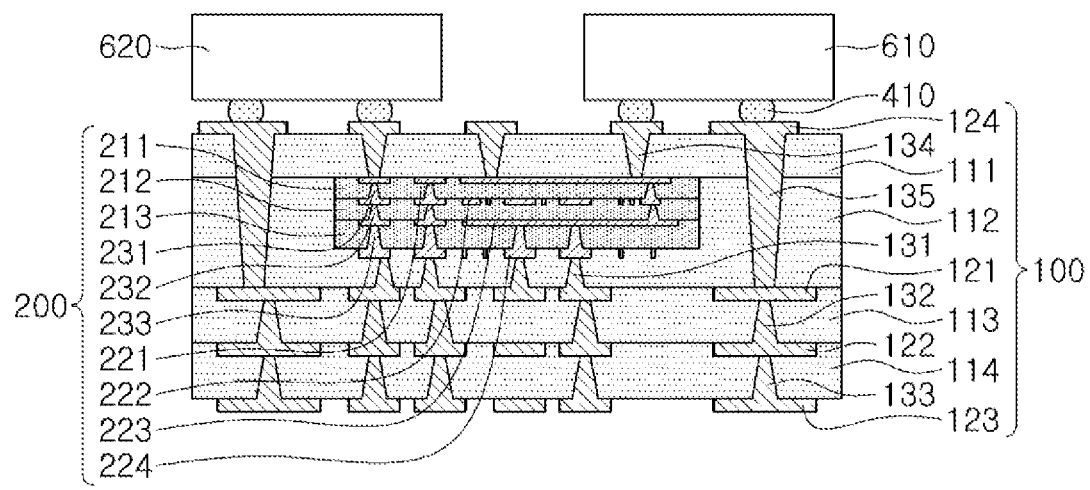

FIG. 11 is a schematic cross-sectional view illustrating a modified example of the connection structure embedded substrate of FIG. 3.

A connection structure embedded substrate 700A2 according to a modified example of FIG. 11 may further include a first electronic component 610 and a second electronic component 620, disposed on a side of one surface of a first printed circuit board 100, and a first electrical connection metal 410 connecting the first and second electronic components 610 and 620 and at least one of a plurality of first wiring layers 121, 122, 123, and 124 to each other, as compared with the connection structure embedded substrate 700A1 according to an exemplary embodiment.

A connection structure 200 may electrically connect the first and second electronic components 610 and 620, mounted in parallel on a printed circuit board 100, to each other. For example, the first and second electronic components 610 and 620 may be electrically connected to each other through the plurality of first wiring layers 121, 122, 123, and 124, or the like, of a connection structure 200.

Each of the first and second electronic components 610 and 620 may be a semiconductor chip. In this case, the semiconductor chip may be an integrated circuit (IC) in which several hundreds to several millions of elements or more are integrated in a single chip. In this case, the IC may be a processor chip (more specifically, an application processor (AP)) such as a central processor (for example, a CPU), a graphic processor (for example, a graphics processing unit (GPU)), a field programmable gate array (FPGA), a digital signal processor, a cryptographic processor, a microprocessor, a microcontroller, or the like, but exemplary embodiments are not limited thereto. For example, the IC may be a logic chip such as a memory chip such as a volatile memory (for example, a DRAM), a nonvolatile memory (for example, a ROM), a flash memory, a high bandwidth memory (HBM), or the like, an analog-to-digital converter, a logic chip such as an application-specific IC (ASIC), or the like, or a different type of IC such as a power management IC (PMIC). As a non-limiting example, the first electronic component 610 may include a processor such as a GPU and the second electronic component 620 may include a memory chip such as an HBM, but exemplary embodiments are not limited thereto.

Each of the first and second electronic components 610 and 620 may be formed based on an active wafer. In this case, a base material of a body may be silicon (Si), germanium (Ge), gallium-arsenide (GaAs), or the like. Various circuits may be formed on the body. Connection pads for electrically connecting the first and second electronic components 610 and 620 to other components may be formed on each body. The connection pads may include a conductive material such as aluminum (Al), copper (Cu), or the like. Each of the first and second electronic components 610 and 620 may be a bare die. In this case, a bump may be disposed on a connection pad, so that the first and second electronic components 610 and 620 may be mounted on a first printed circuit board 100 using a first electrical connection metal as a medium. For example, the first and second electronic components 610 and 620 may be electrically connected to the first to fourth wiring layers 124 disposed on the connection structure 200 of the first printed circuit board 100 using the first electrical connection metal 410 as a medium. As a result, the first and second electronic components 610 and 620 may be electrically connected to the connection structure 200 through a 1-4-th wiring via layers 134 on the connection structure 200. Each of the first and second electronic components 610 and 620 may be a packaged die. In this case, a separate insulating layer and a separate redistribution layer may be further formed on the connection pad, and the bump may be connected to the redistribution layer.

The first electrical connection metal 410 may be formed of a low-melting-point metal, for example, a solder such as tin-aluminum-copper (Sn—Al—Cu), a paste including the solder, or the like. However, the material of the first electrical connection metal 410 is only an example and is not limited thereto. The first electrical connection metal 410 may be a land, a ball, a pin, or the like. The first electrical connection metal 410 may have a single-layer structure or a multilayer structure. When the first electrical connection metal 410 has a multilayer structure, the first electrical connection metal 410 may include a copper pillar and a solder. When the electrical connection metal 410 has a single-layer structure, the electrical connection metal 410 may include a tin-silver solder or copper. However, this is only an example, and exemplary embodiments are not limited thereto.

The same descriptions as described in the above-described connection structure embedded substrate 700A1 may be applied to the overlapping elements, so that detailed descriptions thereof will be omitted.

Figure 12:
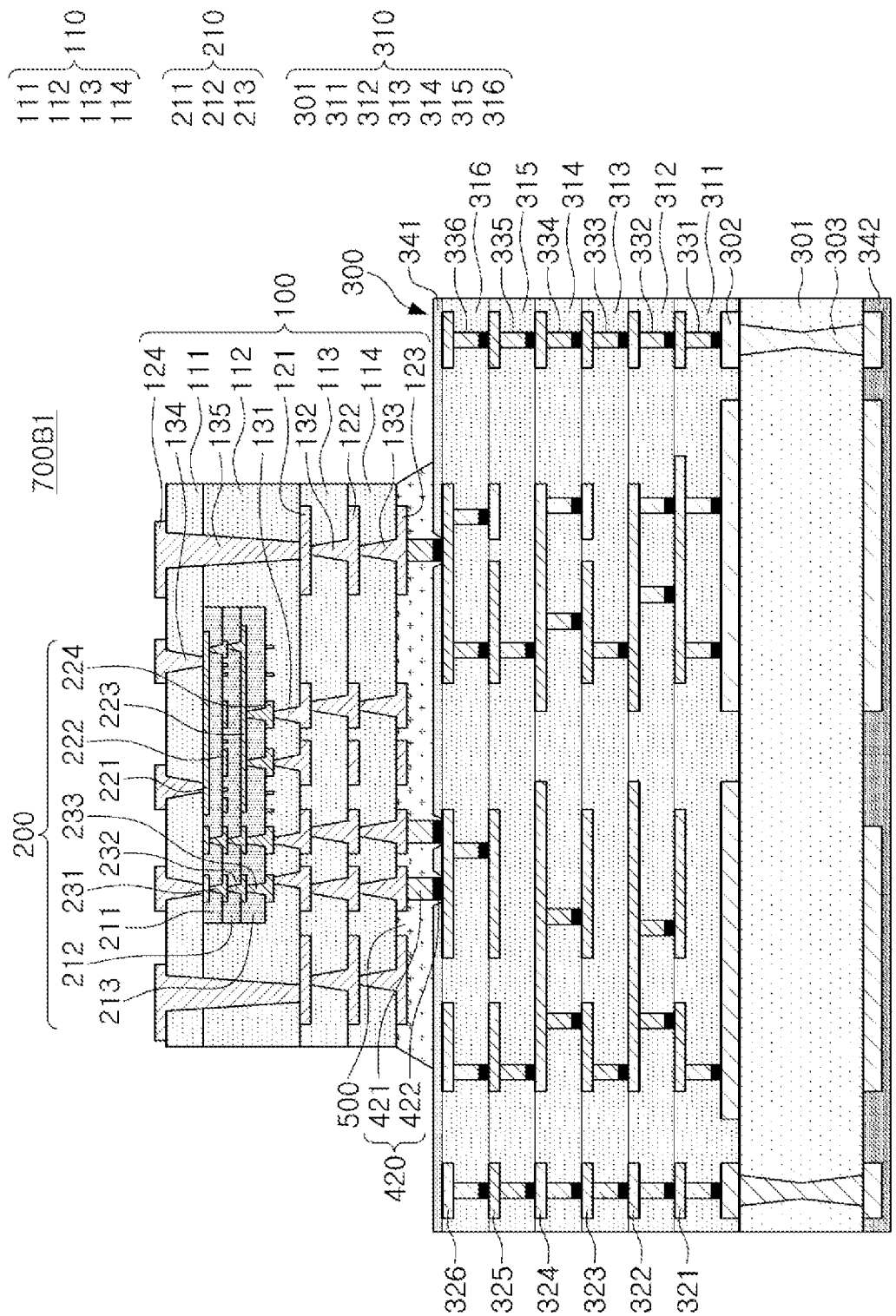
FIG. 12 is a schematic cross-sectional view illustrating an example of a substrate structure.

FIG. 12 is a schematic cross-sectional view illustrating an example of a substrate structure.

FIG. 12 illustrates a structure of a substrate structure 700B1 according to an exemplary embodiment. The substrate structure 700B1 may include the above-described first printed circuit board 100 and the above-described connection structure 200 embedded in the first printed circuit board 100 as they are. The substrate structure 700B1 may include a second printed circuit board 300 having one surface on which the first printed circuit board 100 embedding the connection structure 200 is mounted, a second electrical connection metal 420 connecting the first and second printed circuit boards 100 and 300 to each other, and an insulating film 500 disposed on a side surface of the second electrical connection metal 420.

For example, the above-described connection structure embedded substrate 700A1 may be disposed on one side of the second printed circuit board 300 such that the other side of the first printed circuit board 100 is directed toward the second printed circuit board 300.

The second printed circuit board 300 may include a second insulating body 310 including a core layer 301 and a plurality of second insulating layers 311, 312, 313, 314, 315, and 316 disposed on the core layer 301, a core wiring layer 302 disposed on at least one of inside and outside of the second insulating body 310, a second through-via 303 electrically connecting core wiring layers 302 to each other, a plurality of second wiring layers 321, 322, 323, 324, 325, and 326, a plurality of metal bonding portions 331, 332, 333, 334, 335, and 336 electrically connecting the core wiring layer 302 and the plurality of second wiring layers 321, 322, 323, 324, 325, and 326 to each other, and passivation layers 341 and 342.

A material of the core layer 301 and a material of the plurality of second insulating layers 311, 312, 313, 314, 315, and 316, disposed on the core layer 301, may each be an insulating material including an organic material. The insulating material may be a photosensitive insulating material such as a PID, a thermosetting resin such as an epoxy resin or a thermoplastic resin such as a polyimide resin, or a material including a reinforcing material such as an inorganic filler such as silica and/or glass fiber, such as prepreg, ABF, or the like. The number of the plurality of second insulating layers 311, 312, 313, 314, 315, and 316 may be greater or less than the example illustrated in the drawing. Boundaries between the plurality of second insulating layers 311, 312, 313, 314, 315, and 316 may be distinct or indistinct.

In the present disclosure, the plurality of second insulating layers 311, 312, 313, 314, 315, and 316 may use the same insulating material described above, or may include different insulating materials. For example, different types of insulating materials may be alternately laminated, so that one type of insulating material may function as a bonding sheet for improving bonding force between different types of insulating materials.

A metal material may be used as a material for the plurality of second wiring layers 321, 322, 323, 324, 325, and 326. The metal material may be copper (Cu), aluminum (Al), silver (Ag), Tin (Sn), gold (Au), nickel (Ni), lead (Pb), titanium (Ti), or alloys thereof. Each of the plurality of second wiring layers 321, 322, 323, 324, 325, and 326 may perform various functions depending on a design. For example, the plurality of second wiring layers 321, 322, 323, 324, 325, and 326 include a ground pattern, a power pattern, a signal pattern, and the like. The second wiring layers 321, 322, 323, 324, 325, and 326 may be formed by a plating process such as AP, SAP, MSAP, TT, or the like, and thus, may include a seed layer, an electroless plating layer, and an electroplating layer formed based on the seed layer. The number of the plurality of second wiring layers 321, 322, 323, 324, 325, and 326 may be greater or less than the example illustrated in the drawing. When the plurality of second wiring layers 321, 322, 323, 324, 325, and 326 are provided in the form of a resin coated copper (RCC), they may further include a primer copper foil, as necessary. The number of the plurality of second wiring layers 321, 322, 323, 324, 325, and 326 may be greater or less than the example illustrated in the drawing. The plurality of first wiring layers 121, 122, 123, and 124 of the first printed circuit board 100 may have a line width, a pitch, and a space smaller than those of the plurality of second wiring layers 321, 322, 323, 324, 325, and 326 of the second printed circuit board 300.

A plurality of metal bonding portions 331, 332, 333, 334, 335, 336 may be formed to have a multilayer structure or a single-layer structure. As illustrated in FIG. 12, when the plurality of metal bonding portions 331, 332, 333, 334, 335, and 336 are formed to have a multiple structure, the plurality of metal bonding portions 331, 332, 333, 334, 335, and 336 may include first metal layers 331H, 332H, 333H, 334H, 335H, and 336H and second metal layer 331L, 332L, 333L, 334L, 335L, and 336L, respectively.

In this case, the first metal layers 331H, 332H, 333H, 334H, 335H, and 336H may include a high-melting-point metal, and the second metal layers 331L, 332L, 333L, 334L, 335L, and 336L may include a low-melting-point metal. A melting point of the first metal layers 331H, 332H, 333H, 334H, 335H, and 336H may be higher than a melting point of the second metal layers 331L, 332L, 333L, 334L, 335L, and 336L.

In the present disclosure, a melting point of a metal may refer to a temperature at which a metal material changes from a solid state to a liquid state. In the present disclosure, a description will be provided based on a structure in which a plurality of metal bonding portions 331, 332, 333, 334, 335, and 336 are formed to have a multilayer structure.

The high-melting-point metal may include copper (Cu), silver (Ag), palladium (Pd), aluminum (Al), nickel (Ni), titanium (Ti), gold (Au), platinum (Pt), or the like, having excellent electrical characteristics. The high-melting-point metal may be the same as the above-described material of the plurality of second wiring layers 321, 322, 323, 324, 325, and 326, but may be different therefrom.

The low-melting-point metal may refer to a metal having a lower melting point than the high-melting-point metal. At least a portion of the low-melting-point metal may be melted when the core wiring layer 301, the second wiring layer 321, 322, 323, 324, 325, and 326, and the metal bonding portions 331, 332, 333, 334, 335, and 336 are bonded.

In addition, the low-melting-point metal melted in the second metal layer 331L, 332L, 333L, 334L, 335L, and 336L may form an inter-metallic compound (IMC) in a space from the second wiring layers 321, 322, 323, 324, 325, and 326 or the first metal layers 331H, 332H, 333H, 334H, 335H, and 336H.

The low-melting-point metal may be formed of a solder material. The term "solder" refers to a metal material which may be used in soldering, and may be a lead-containing alloy but may not contain lead (Pb). For example, the solder may be an alloy of metals selected from tin (Sn), silver (Ag), and copper (Cu). Specifically, the solder used in an exemplary embodiment may be a tin-silver-copper alloy in which the content of tin is 90% or more of the entire solder.

Although not illustrated, the plurality of metal bonding portions 331, 332, 333, 334, 335, and 336 may include a single-layer metal material. In this case, the core wiring layer 302 and the plurality of metal bonding portions 331, 332, 333, 334, 335, and 336 may be connected without distinction therebetween.

The second electrical connection metal 420 may electrically connect the first and second printed circuit boards 100 and 300 to each other. Referring to FIG. 12, the second electrical connection metal may electrically connect the 1-3-th wiring layer 123 of the first printed circuit board 100 and the second wiring layer 326 of the second printed circuit board 300 to each other.

Each of the second electrical connection metals 420 may be formed of a low-melting-point metal, for example, a solder such as tin-aluminum-copper (Sn—Al—Cu), or a paste including the solder. However, this is only an example and the material is not limited thereto. The second electrical connection metal 420 may be a land, a ball, a pin, or the like. The second electrical connection metal 420 may be formed to have a multilayer structure or a single-layer structure. When the second electrical connection metal 420 is formed to have a multilayer structure, the second electrical connection metal 420 may include a copper pillar and a solder. When the second electrical connection metal 420 is formed to have a single-layer structure, the second electrical connection metal 420 may include a tin-silver solder or copper. However, this is also only an example and exemplary embodiments are not limited thereto.

FIG. 12 illustrates a structure in which the second electrical connection metal 420 is formed to have a multilayer structure. In this case, the second electrical connection metal 420 may include a low-melting-point metal layer 422 and a high-melting-point metal layer 421. The low-melting-point metal layer 422 and the high-melting-point metal layer 421 may include a low-melting-point metal material and a high-melting-point metal material, respectively. The above description may be applied the low-melting-point and high-melting-point metals as it is.

The insulating film 500 may be a film containing an insulating resin, and may be disposed on a side surface of the second electrical connection metal 420, electrically connecting the first printed circuit board 100 and the second printed circuit board 300 to each other, to prevent damage to the second electrical connection metal 420 and to insulate the second electrical connection metal 420 from an external entity.

In addition, the insulating film 500 may be disposed between the first and second printed circuit boards 100 and 300 to insulate a wiring layer of an outermost layer, disposed on a side on which the first and second printed circuit boards 100 and 300 face each other, from an external entity. For example, as illustrated in FIG. 12, the insulating film 500 may prevent damage to the 1-3-th wiring layers 123 and the second wiring layers 326 and may simultaneously insulate the 1-3-th wiring layers 123 and the second wiring layers 326 from an external entity.

An insulating material may be used as a material of the insulating film 500. The insulating material may be a photosensitive insulating material such as a PID, a thermosetting resin such as an epoxy resin or a thermoplastic resin such as a polyimide resin, or a material including a reinforcing material such as an inorganic filler such as silica and/or glass fiber, such as prepreg, ABF, or the like. Alternatively, the insulating film 500 may be formed of a non-conductive paste (NCP) or a non-conductive film (NCF).

Although not illustrated, a reinforcing plate may be additionally disposed on at least one of the plurality of second insulating layers 311, 312, 313, 314, 315, and 316 of the second printed circuit board 300 to prevent board warpage. The reinforcing plate may be a metal plate advantageous for controlling warpage or an insulating material such as rigidity-reinforced prepreg, or the like. When the reinforcing plate is a metal plate, the reinforcing plate may serve as a ground for heat dissipation or electromagnetic interference (ENIU) shielding.

As described in the present embodiment, the first printed circuit board 100 and the second printed circuit board 300, in which the connection structure 200 is embedded, may be coupled to each other after manufactured by separate manufacturing processes. Thus, a defect rate in the entire product may be reduced to improve a yield.

For example, as compared with a process in which the first and second printed circuit boards 100 and 300 are collectively manufactured by a single process, the first and second printed circuit boards 100 and 300 may be separately manufactured to reduce disposal costs and loss when defects occur.

The same descriptions as in the above-described example embodiment may be applied to the overlapping elements, so that detailed descriptions thereof will be omitted.

Figure 13:
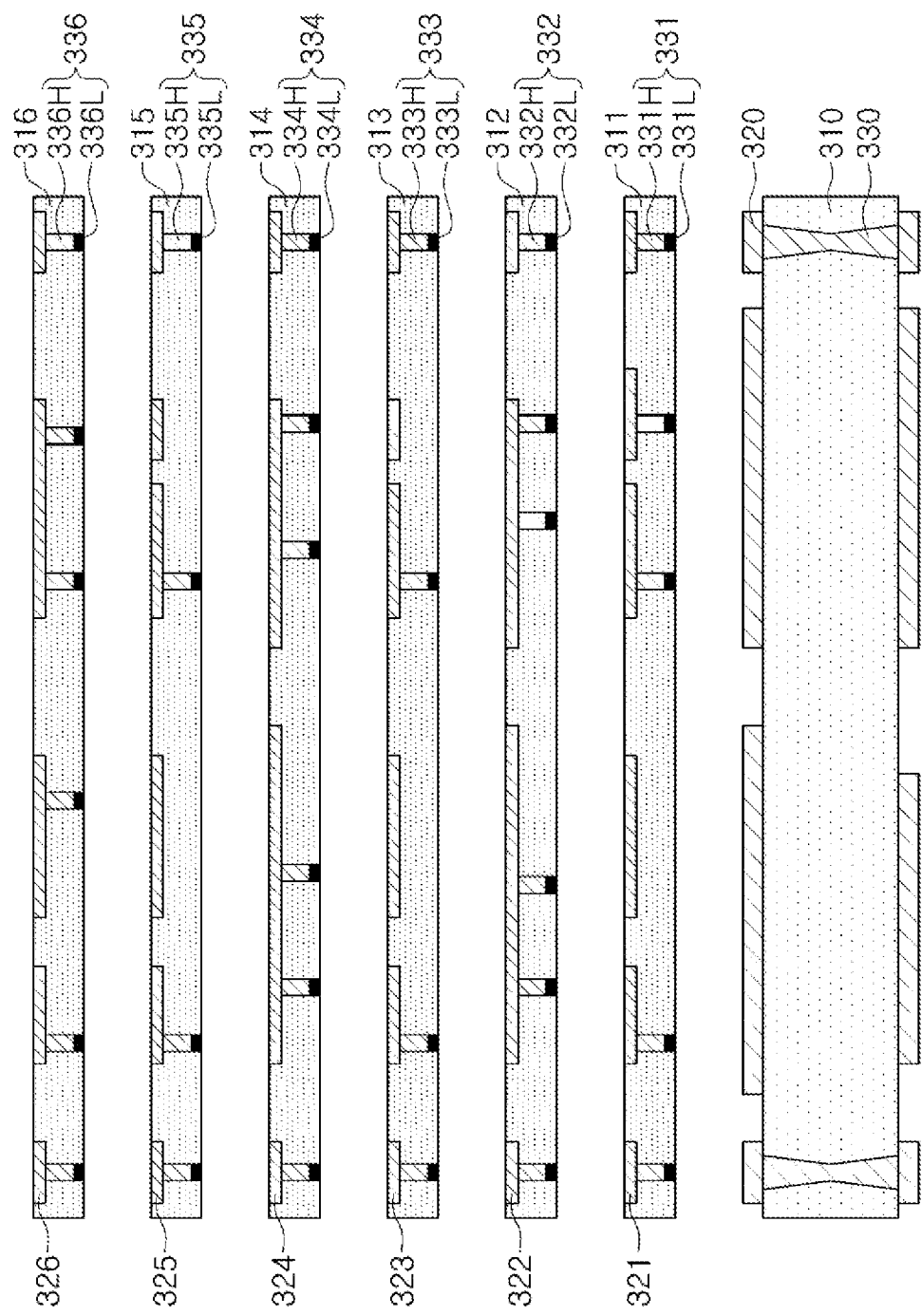
FIGS. 13 and 14 are process flow diagrams illustrating a portion of a process of manufacturing the substrate structure of FIG. 12.
Figure 14:
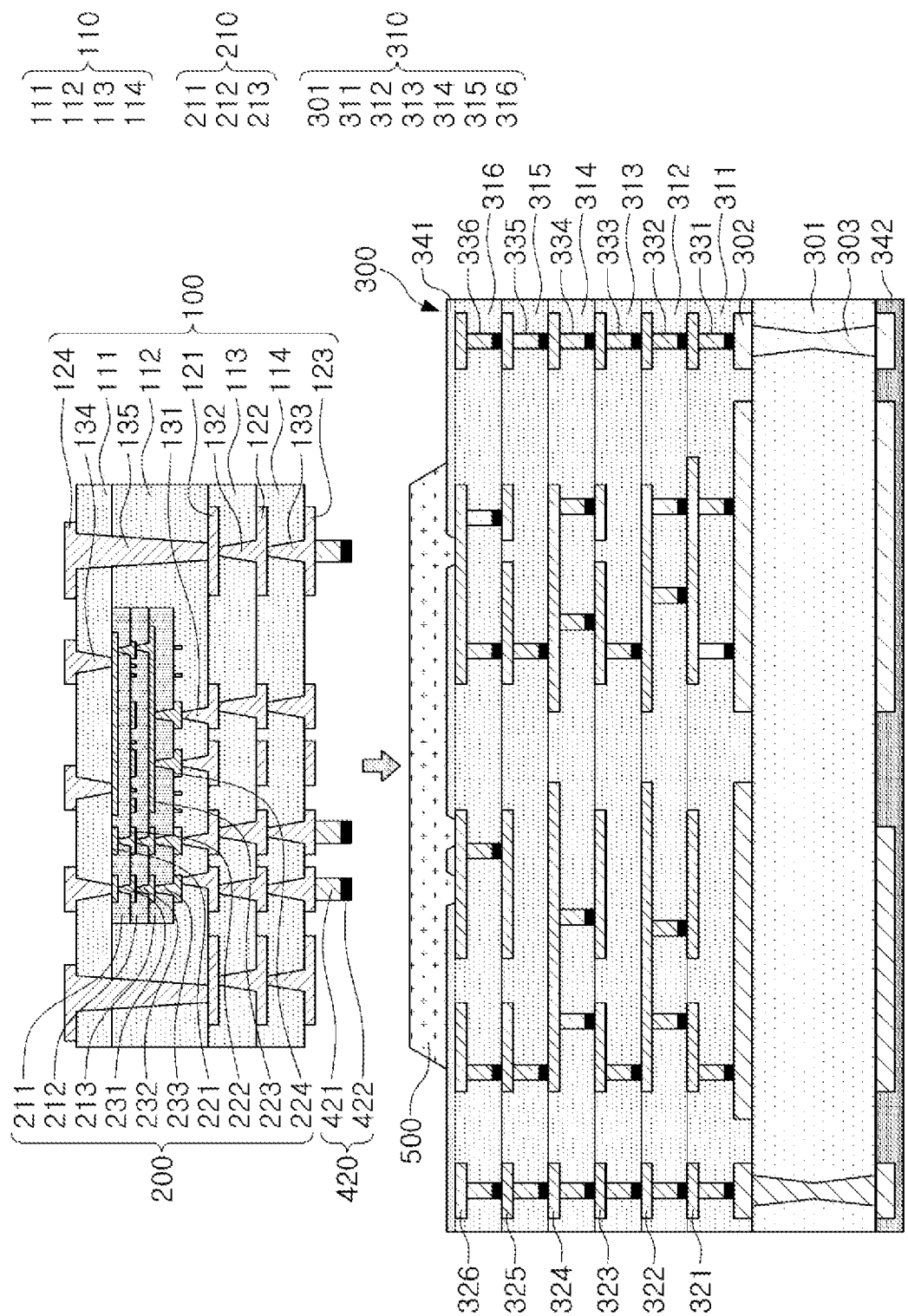

FIGS. 13 and 14 are process flow diagrams illustrating a portion of a process of manufacturing the substrate structure of FIG. 12.

A second printed circuit board 300 according to the present disclosure may be manufactured by a batch lamination method, which is disclosed in FIG. 13. As disclosure in FIG. 13, before lamination, a core layer 301 and a plurality of second insulating layers 311, 312, 313, 314, 315, and 316, on which a plurality of second wiring layers 321, 322, 323, 324, 325, 326 and a plurality of metal bonding portions 331, 332, 333, 334, 335, and 336 are formed, may be separately manufactured.

Then, the second printed circuit board 300 may be manufactured by heating and pressing each layer at the same time as heating to a high temperature and then providing first and second passivation layers 341 and 342, each having an opening, on an outermost layer.

According to the above-described manufacturing process, an electroless plating layer may not be formed between the plurality of second wiring layers 321, 322, 323, 324, 325, and 326 and the plurality of metal bonding portions 331, 332, 333, 334, 335, and 336. For example, the plurality of metal bonding portions 331, 332, 333, 334, 335, and 336 may be formed in bottom-up manner using the plurality of second wiring layers 321, 322, 323, 324, 325, and 326 as seed layers. Accordingly, bonding force between the plurality of second wiring layers 321, 322, 323, 324, 325, and 326 and the plurality of metal bonding portions 331, 332, 333, 334, 335, and 336 may be improved. For example, since the electroless plating layer is not formed, bonding force between the wiring layer and the first metal layers 331H, 332H, 333H, 334H, 335H, and 336H may be prevented from being deteriorated by pores of the electroless plating layer.

Referring to FIG. 14, an insulating film 500 may be disposed on the first passivation layer 341 disposed on one side of the second printed circuit board 300. The insulating film 500 may cover the second wiring layer 326 exposed to the opening of the first passivation layer 341.

The second electrical connection metal 420 may be mounted on the second printed circuit board 300 while being disposed on the 1-3-th wiring layers 113 of the first printed circuit board 100.

In a process of mounting the first printed circuit board 100 on the second printed circuit board 300 through the second electrical connection metal 420, the second electrical connection metal 420 may penetrate through the insulating film 500 to be electrically connected to the second wiring layer 326. Through such a process, aside surface of the second electrical connection metal 420 may be covered with the insulating film 500 and may be insulated from an external entity, and at least a portion of the third wiring layer 113 may also be covered with the insulating film 500.

The same descriptions as in the above-described example embodiment may be applied to the overlapping elements, so that detailed descriptions thereof will be omitted.

Figure 15:
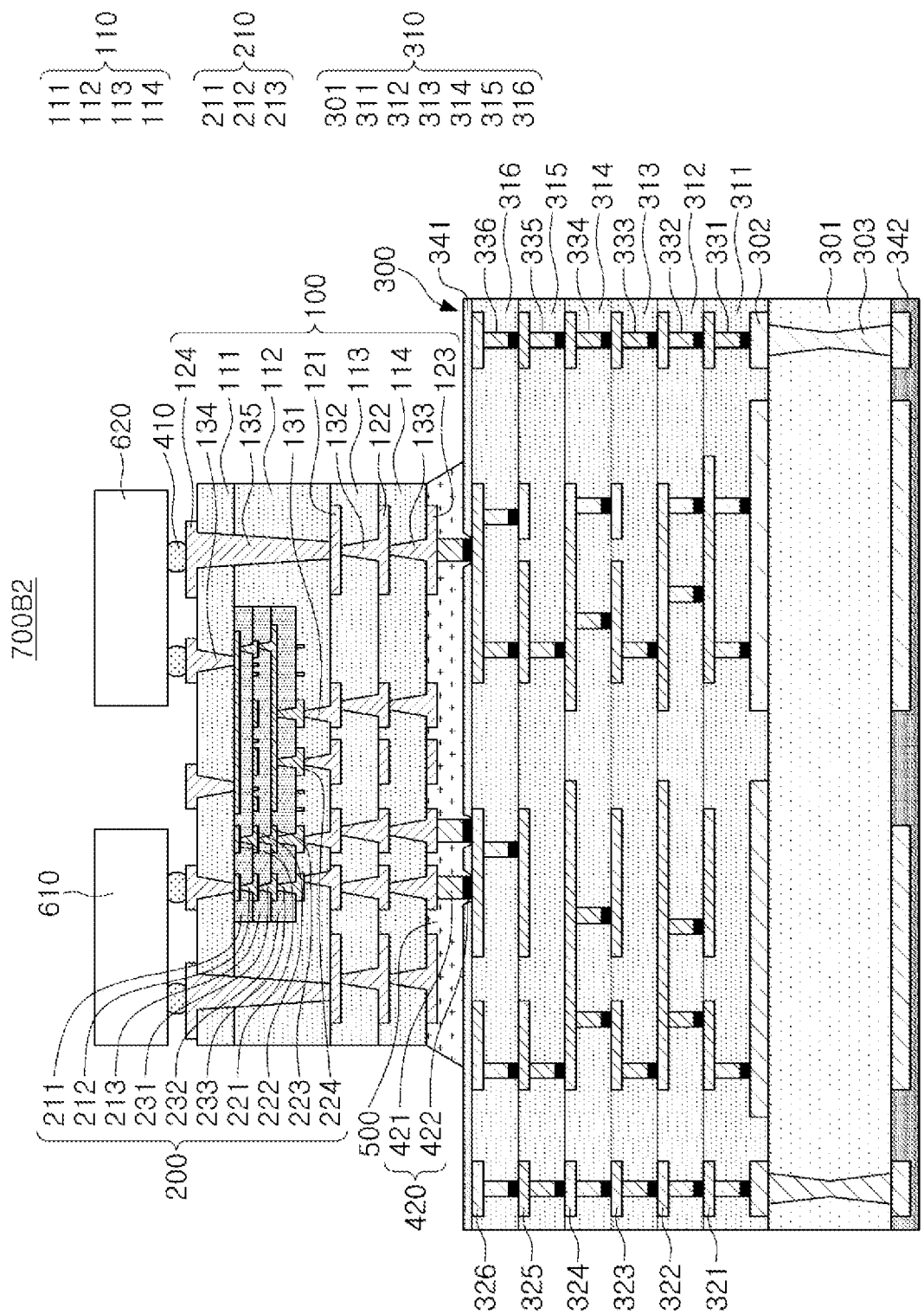
FIG. 15 is a schematic cross-sectional view illustrating a modified example of the substrate structure of FIG. 12.

FIG. 15 is a schematic cross-sectional view illustrating a modified example of the substrate structure of FIG. 12.

A substrate structure 700B2 according to a modified example disclosed in FIG. 15 may have a structure in which a first electronic component 610 and a second electronic component 620 are further mounted on the substrate structure 700A1 according to an exemplary embodiment.

Referring to FIG. 15, a first electronic component 610 and a second electronic component 620 may be disposed on the first printed circuit board 100, and the first and second electronic components 610 and 620 and the 1-4-th wiring layers 124 may be electrically connected by the first electrical connection metal 410.

Although not illustrated, a passivation layer may be additionally disposed on an outermost layer of the first printed circuit board 100 to protect a wiring layer of the outermost layer from physical and chemical damage, and the first electrical connection metal 410 may be disposed with an opening formed in the passivation layer.

While detailed characteristics of the first and second electronic components 610 and 620 and the first electrical connection metal 410 have been described above, and the same descriptions as in the above-described example embodiment may be applied to the overlapping elements, so that detailed descriptions thereof will be omitted.

Figure 16:
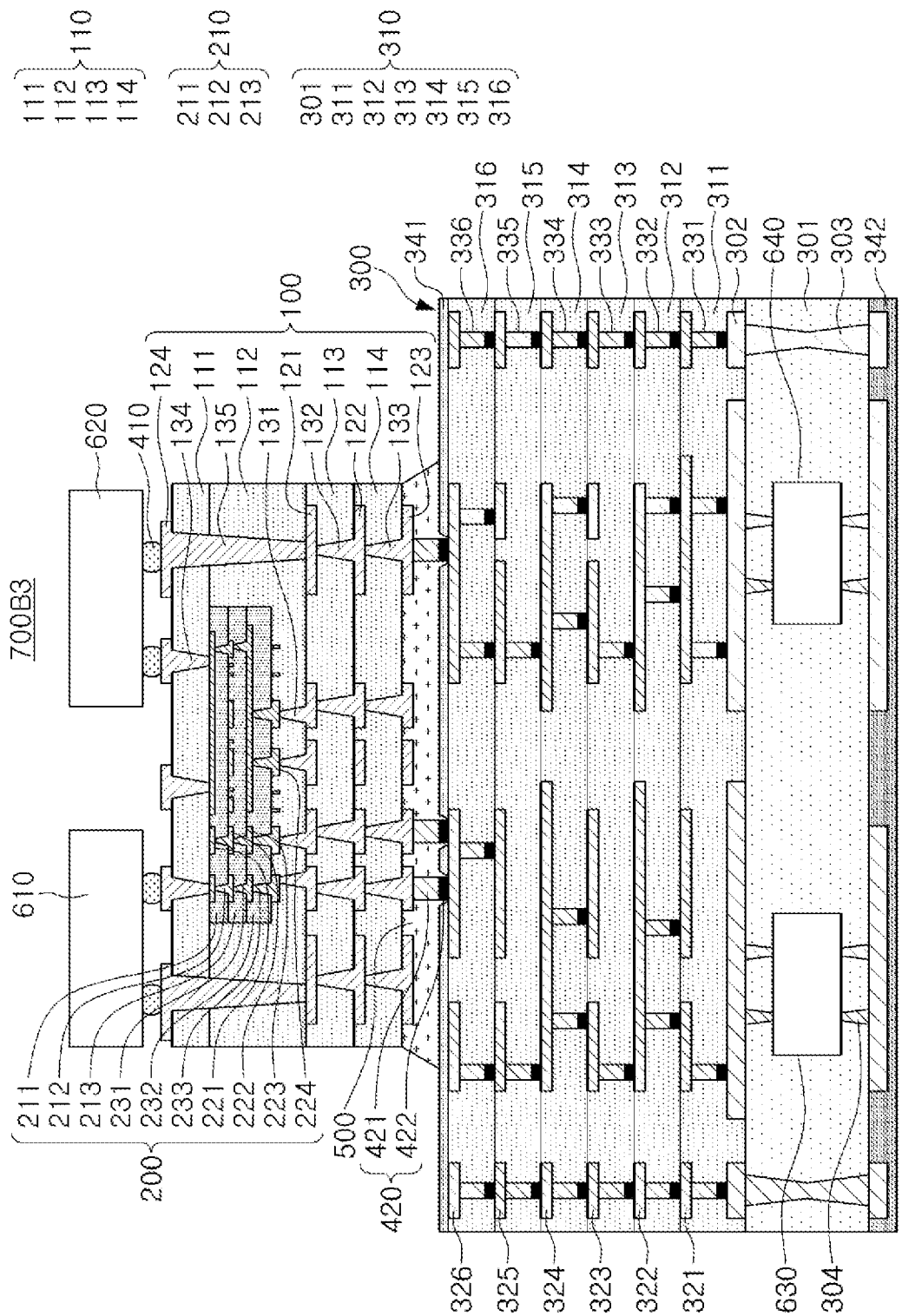
FIG. 16 is a schematic cross-sectional view illustrating another modified example of the substrate structure of FIG. 12.

FIG. 16 is a schematic cross-sectional view illustrating another modified example of the substrate structure of FIG. 12.

A substrate structure 700B3 according to another modified example of FIG. 16 may have a structure in which a third electronic component 630 and a fourth electronic component 640 are further disposed on a core layer 301 of a second printed circuit board 300, as compared with the substrate structure 700B2 according to a modified example of FIG. 15. The third and fourth electronic components 630 and 640 may be disposed in such a manner that they are embedded in a cavity after processing the cavity in the core layer 301, and may be connected to a core wiring layer 302 through a connection via 304. The core layer 301, in which the third and fourth electronic components are embedded, may have a thickness greater than a thickness of each of the second insulating layers 311, 312, 313, 314, 315, and 316.

The third and fourth electronic components 630 and 640 may be provided as one or more components. The third and fourth electronic components 630 and 640 may be the same semiconductor chips as the first and second electronic components 610 and 620, but may be known passive elements such as capacitors, inductors, or the like.

Each of the third and fourth electronic components 630 and 640 may be an independent chip-type component, may include an external electrode, and may be connected to a connection via 304 through an external electrode.

The same descriptions as in the above-described example embodiment may be applied to the overlapping elements, so that detailed descriptions thereof will be omitted.

Figure 17:
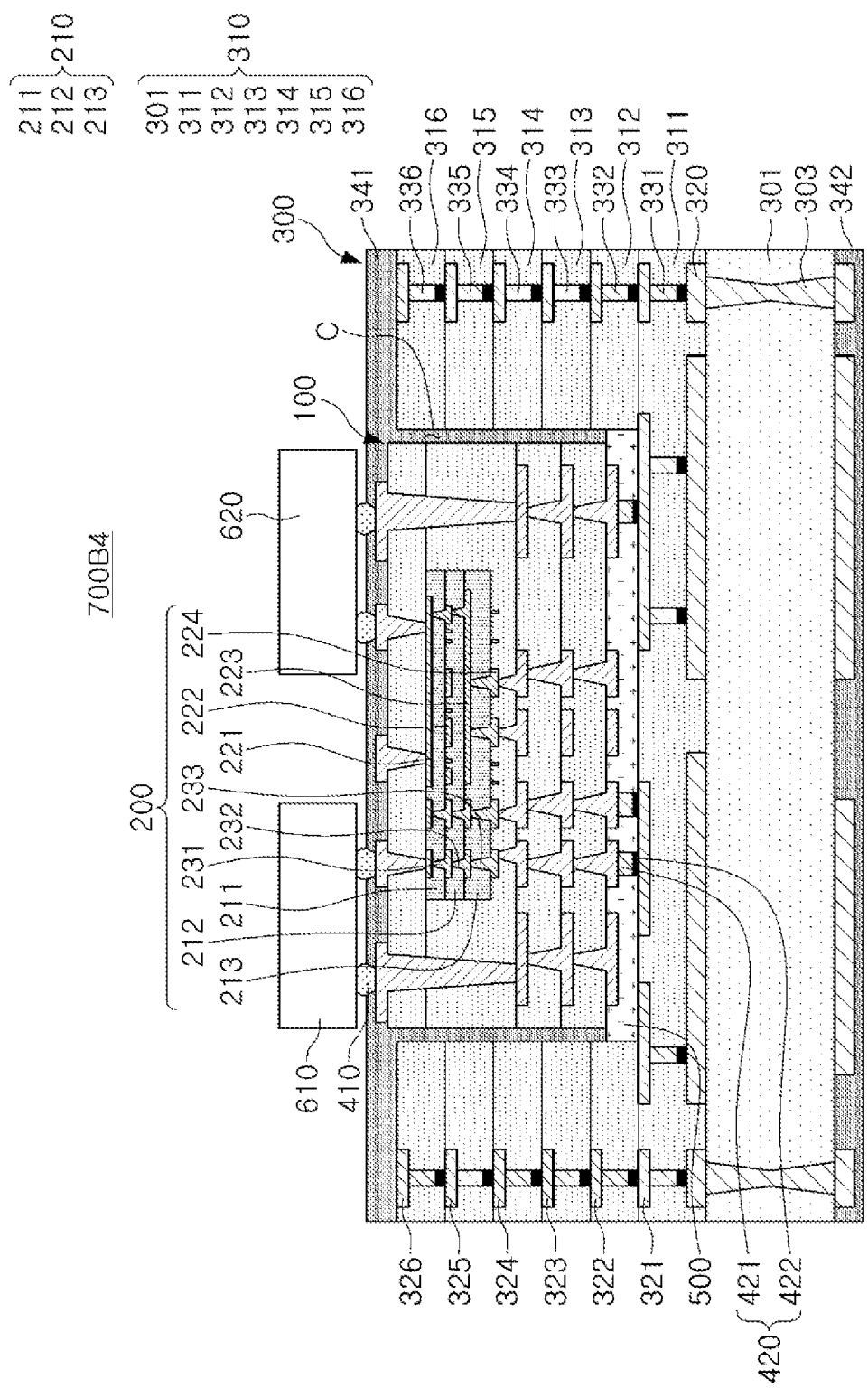
FIG. 17 is a schematic cross-sectional view illustrating another modified example of the substrate structure of FIG. 12.
Figure 18:
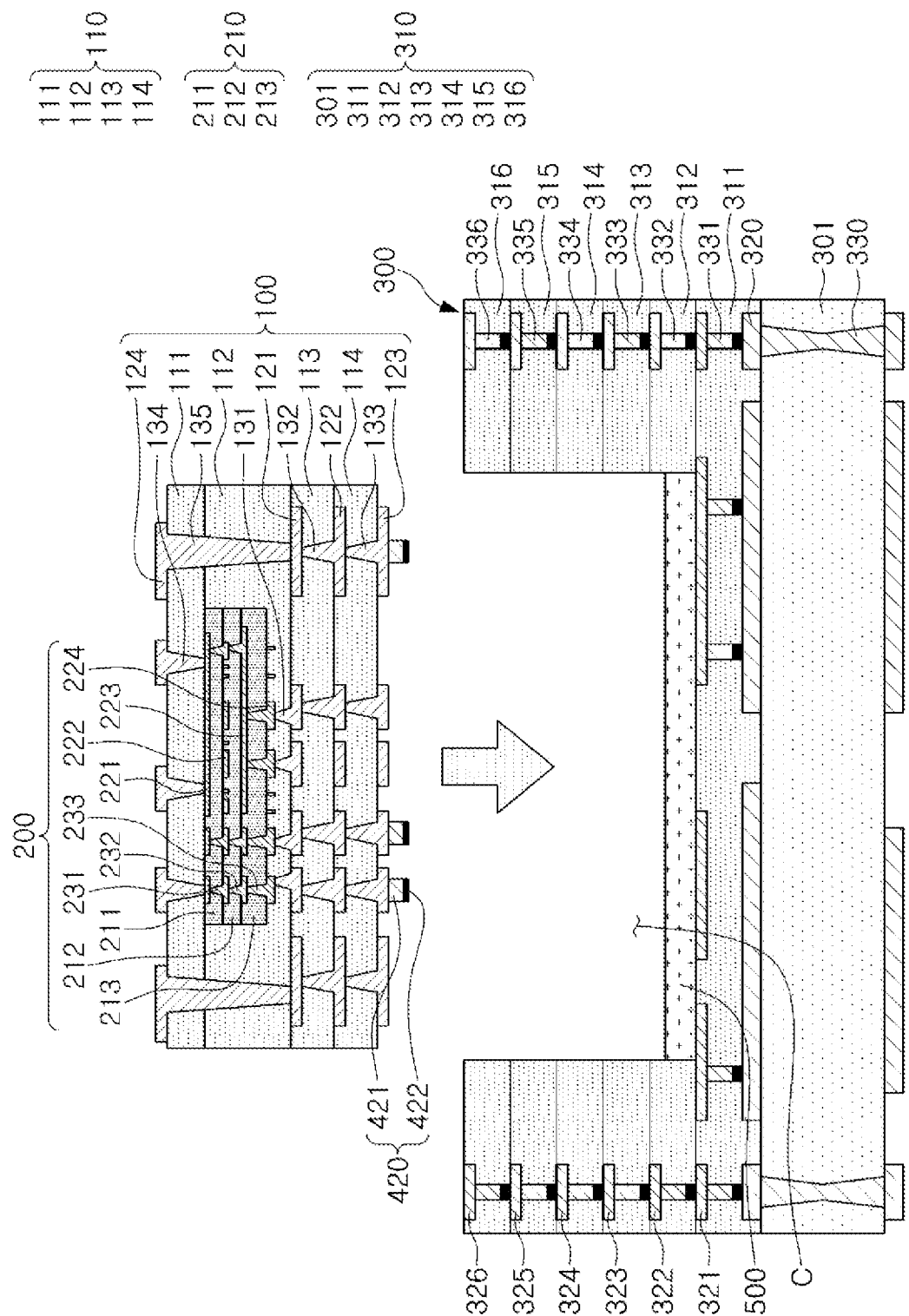
FIGS. 18 and 19 are process flow diagrams illustrating a portion of a process of manufacturing the substrate structure of FIG. 17.
Figure 19:
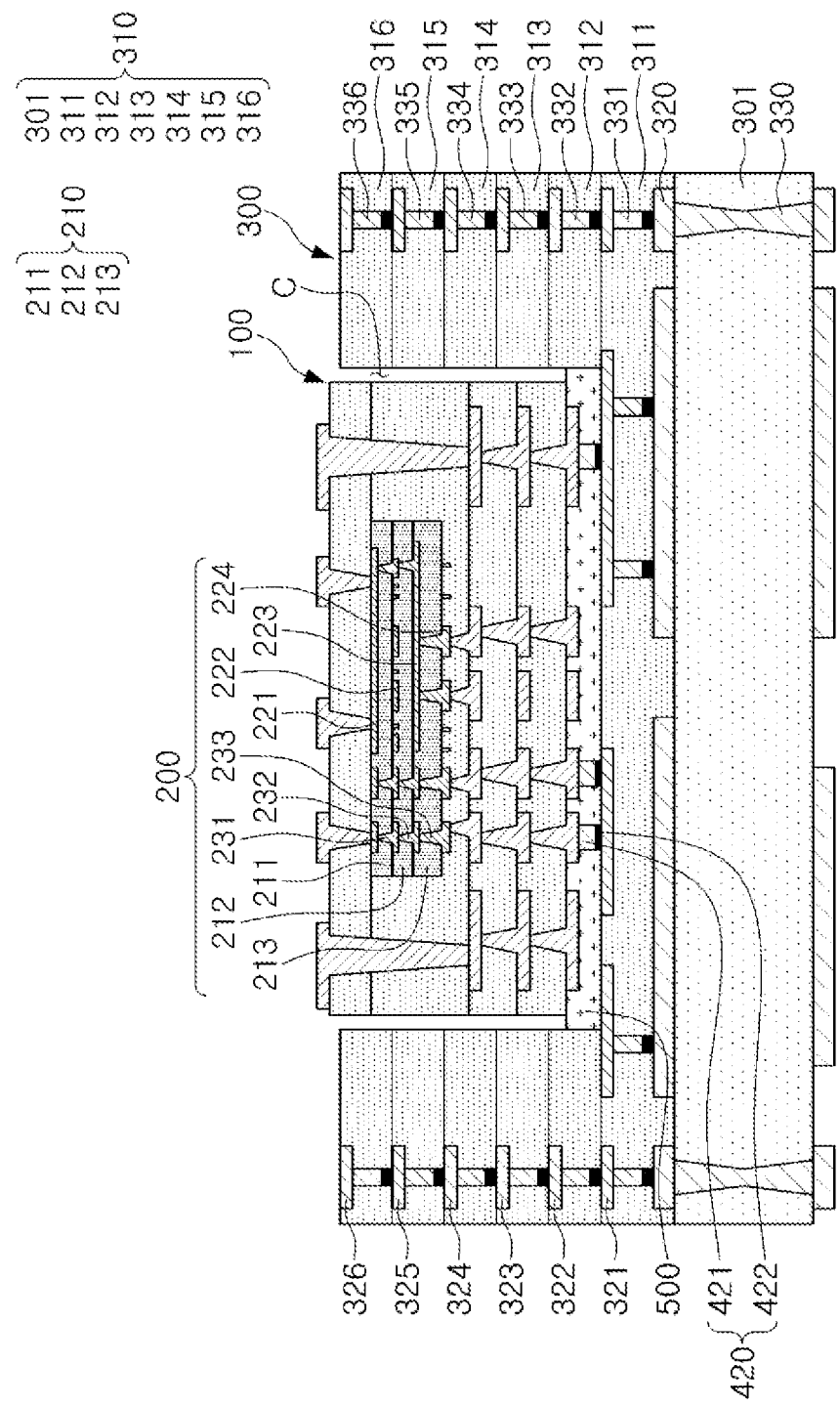

FIG. 17 is a schematic cross-sectional view illustrating another modified example of the substrate structure of FIG. 12, and FIGS. 18 and 19 are process flow diagrams illustrating a portion of a process of manufacturing the substrate structure of FIG. 17.

The substrate structure 700B4 according to another modified example FIG. 17 may have a structure in which a cavity C formed in a second printed circuit board 300 and a first printed circuit board 100 is embedded in the cavity C, as compared with the substrate structure 700B1 according to an exemplary embodiment of FIG. 12.

In a second insulating body 310 of the second printed circuit board 300, a cavity C may be formed to penetrate through at least a portion of the second insulating body 310. As a method of forming the cavity C, any method used in a known cavity forming process may be used without limitation. For example, a mechanical drilling process such as laser processing, or the like, or a blasting process may be used. In this case, one of a plurality of second wiring layers 321, 322, 323, 324, 325, and 326 may serve as a stopper. Alternatively, a separate stopper may be disposed in the second insulating body 310, and then may etched to be removed after processing the cavity C.

After processing the cavity C, at least a portion of one of the plurality of second wiring layers 321, 322, 323, 324, 325, and 326 may be exposed to a lower surface of the cavity C. During the above-described processing of the cavity C, a portion of a second wiring layer may be exposed. Alternatively, the cavity C may be processed before the wiring layer is exposed, and then a portion of the second insulating body 310 may be removed through a plasma processing treatment to expose a wiring layer to the cavity C.

An insulating film 500 may be disposed on the lower surface of the cavity C on which at least a portion of one of the plurality of second wiring layers 321, 322, 323, 324, 325, and 326 is exposed. As illustrated in FIGS. 18 and 19, a first printed circuit board 100, on which a second electrical connection metal 410 is disposed, may be disposed in the cavity C.

Similarly to the above-described process, the second electrical connection metal 410 may penetrate through the insulating film 500 to be electrically connected to one of the plurality of second wiring layers 321, 322, 323, 324, 325, and 326.

As described above, the first printed circuit board 100 may be embedded in the cavity C of the second printed circuit board 300 to implement a structure of the substrate structure 700B4 which may be further thinned and miniaturized.

A surplus space of the cavity C may be filled with an insulating layer having fluidity and flowability (the surplus space referring to a space, other than a space in which the second printed circuit board 300 is disposed). For example, a first passivation layer 341 disposed on an outermost layer of the second printed circuit board 300 may fill the surplus space of the cavity C and may cover a portion of the first printed circuit board 100. However, exemplary embodiments are not limited thereto, and a separate insulating material or encapsulant having fluidity may fill the cavity C to cover the first printed circuit board 100.

As described above, according to exemplary embodiments, a connection structure may be embedded in a substrate without a separate adhesive for bonding the connection structure.

In addition, a printed circuit board, which may be further thinned and miniaturized by embedding a connection structure, may be provided.

In addition, a printed circuit board, which improve yield in a substrate manufacturing process, may be provided.

In addition, a printed circuit board, which may reduce signal loss to improve electrical signal transmission characteristics, may be provided.

In the example embodiments, the terms "side portion," "side surface," and the like, may be used to refer to a surface formed taken in right/left directions with reference to a cross-section in the diagrams for ease of description, the terms "upper side," "upper portion," "upper surfaces," and the like, may be used to refer to a surface formed in an upward direction with reference to a cross-section in the diagrams for ease of description, and the terms "lower side," "lower portion," "lower surface," and the like, may be used to refer to a surface formed in a downward direction. The notion that an element is disposed on a side region, an upper side, an upper region, or a lower resin may include the configuration in which the element is directly in contact with an element configured as a reference in respective directions, and the configuration in which the element is not directly in contact with the reference element. The terms, however, may be defined as above for ease of description, and the scope of right of the example embodiments is not particularly limited to the above terms.

In the example embodiments, the term "connected" may not only refer to "directly connected" but also include "indirectly connected" by means of an adhesive layer, or the like. Also, the term "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

In the example embodiments, the term "example embodiment" may not refer to one same example embodiment, and may be provided to describe and emphasize different unique features of each example embodiment. The above suggested example embodiments may be implemented do not exclude the possibilities of combination with features of other example embodiments. For example, even though the features described in one example embodiment are not described in the other example embodiment, the description may be understood as relevant to the other example embodiment unless otherwise indicated.

An expression used in the singular encompasses the expression of the plural, unless it has a clearly different meaning in the context.

While the example embodiments have been illustrated and described above, it will be apparent to those skilled in the art that modifications and variations could be made without departing from the scope of the present invention as defined by the appended claims.

What is claimed is:

1. A connection structure embedded substrate comprising:
   a printed circuit board including a plurality of first insulating layers and a plurality of first wiring layers, respectively disposed on or between the plurality of first insulating layers; and
   a connection structure disposed in the printed circuit board and including a plurality of internal insulating layers and a plurality of internal wiring layers, respectively disposed on or between the plurality of internal insulating layers,
   wherein among the plurality of internal wiring layers, an internal wiring layer disposed in one surface of the connection structure is in contact with one surface of a first insulating layer, among the plurality of first insulating layers, and
   a second insulating layer different from the first insulating layer, among the plurality of first insulating layers, covers and is in contact with a side surface of the connection structure, the side surface of the connection structure extending from the one surface of the connection structure.

2. The connection structure embedded substrate of claim 1, wherein an average line width of the plurality of first wiring layers is greater than an average line width of the plurality of internal wiring layers.

3. The connection structure embedded substrate of claim 1, wherein an average pitch of the plurality of first wiring layers is greater than an average pitch of the plurality of internal wiring layers.

4. The connection structure embedded substrate of claim 1, wherein an average space of the plurality of first wiring layers is greater than an average space of the plurality of internal wiring layers.

5. The connection structure embedded substrate of claim 1, wherein the printed circuit board further includes a plurality of first wiring vias,
   the connection structure further includes a plurality of internal wiring vias, and
   the plurality of first wiring vias include a through-via penetrating through at least two insulating layers, among the plurality of first insulating layers.

6. The connection structure embedded substrate of claim 5, wherein at least a portion of the plurality of first wiring vias penetrates through at least a portion of the plurality of first insulating layers and is connected to the internal wiring layer, disposed in the one surface of the connection structure, among the plurality of internal wiring layers.

7. The connection structure embedded substrate of claim 5, wherein at least one of the plurality of first wiring vias has a shape tapered in a direction opposing the through-via.

8. The connection structure embedded substrate of claim 5, wherein the plurality of internal wiring vias have a shape tapered in a direction opposing the through-via.

9. The connection structure embedded substrate of claim 1, wherein one surface of one of the plurality of insulating layers has a step in a region in contact with an internal insulating layer, disposed on the one surface of the connection structure, among the plurality of internal insulating layers.

10. A substrate structure comprising:
    a first printed circuit board including a first insulating body, a plurality of first wiring layers disposed on at least one of an outside and an inside of the first insulating body, and a plurality of wiring vias connecting the plurality of first wiring layers to each other;
    a connection structure disposed in the printed circuit board and including an internal insulating body and a plurality of internal wiring layers disposed on at least one of an outside and an inside of the internal insulating body; and
    a second printed circuit board having one surface on which the first printed circuit board is disposed and including a second insulating body and a plurality of second wiring layers disposed on at least one of an outside and an inside of the second insulating body,
    wherein among the plurality of first wiring vias, at least one first wiring via has a shape tapered in a direction opposing a direction of at least another wiring via,
    among the plurality of first wiring vias, at least one wiring via has an average diameter different from an average diameter of at least another first wiring via, and
    the second insulating body is spaced apart from the first insulating body and the internal insulating body.

11. The substrate structure of claim 10, wherein the connection structure includes a plurality of internal wiring vias connecting the plurality of internal wiring layers to each other, and
    at least one of the plurality of first wiring vias has a shape tapered in a direction opposing the plurality of internal wiring vias.

12. The substrate structure of claim 10, wherein an average line width of the plurality of first wiring layers is greater than an average line width of the plurality of internal wiring layers, and
    an average line width of the plurality of second wiring layers is greater than an average line width of the plurality of first wiring layers.

13. The substrate structure of claim 10, wherein the second printed circuit board includes a cavity disposed in the second insulating body of the one surface, and
    at least a portion of the first printed circuit board is disposed in the cavity.

14. The substrate structure of claim 10, wherein the second insulating body includes a plurality of second insulating layers, and
    among the plurality of second insulating layers, one second insulating layer has a thickness greater than a thickness of each of the other second insulating layers, and is an insulating layer in which an electronic component is disposed.

15. The substrate structure of claim 10, wherein the second printed circuit board further includes a plurality of metal bonding portions penetrating through at least a portion of the second insulating body, and
    at least a portion of the plurality of metal bonding portions includes a first metal layer and a second metal layer having a melting point lower than a melting point of the first metal layer.

16. The substrate structure of claim 10, further comprising:
- an electrical connection metal connecting the first and second printed circuit boards to each other; and
- an insulating film covering the electrical connection metal.

17. The connection structure embedded substrate of claim 1, wherein among the plurality of internal wiring layers, another internal wiring layer disposed on another surface of the connection structure is in contact with the second insulating layer among the plurality of first insulating layers.

18. A substrate structure comprising:
- a first printed circuit board including a first insulating body, a plurality of first wiring layers disposed on at least one of an outside and an inside of the first insulating body, and a plurality of wiring vias connecting the plurality of first wiring layers to each other;
- a connection structure disposed in the printed circuit board and including an internal insulating body and a plurality of internal wiring layers disposed on at least one of an outside and an inside of the internal insulating body; and
- a second printed circuit board having one surface on which the first printed circuit board is disposed and including a second insulating body and a plurality of second wiring layers disposed on at least one of an outside and an inside of the second insulating body,
- wherein among the plurality of first wiring vias, at least one first wiring via has a shape tapered in a direction opposing a direction of at least another wiring via,
- among the plurality of first wiring vias, at least one wiring via has an average diameter different from an average diameter of at least another first wiring via,
- an average line width of the plurality of first wiring layers is greater than an average line width of the plurality of internal wiring layers, and
- an average line width of the plurality of second wiring layers is greater than an average line width of the plurality of first wiring layers.

19. The substrate structure of claim 18, wherein the connection structure includes a plurality of internal wiring vias connecting the plurality of internal wiring layers to each other, and
- at least one of the plurality of first wiring vias has a shape tapered in a direction opposing the plurality of internal wiring vias.

20. The substrate structure of claim 18, further comprising:
- an electrical connection metal connecting the first and second printed circuit boards to each other; and
- an insulating film covering the electrical connection metal.

* * * * *